US007012325B2

(12) United States Patent
Ahn et al.

(10) Patent No.: US 7,012,325 B2
(45) Date of Patent: Mar. 14, 2006

(54) ULTRA-THIN SEMICONDUCTOR PACKAGE DEVICE AND METHOD FOR MANUFACTURING THE SAME

(75) Inventors: Sang-Ho Ahn, Kyungki-do (KR); Se-Yong Oh, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/008,704

(22) Filed: Dec. 6, 2001

(65) Prior Publication Data

US 2002/0121680 A1 Sep. 5, 2002

(30) Foreign Application Priority Data

Mar. 5, 2001 (KR) ................................ 2001-11182
Jun. 30, 2001 (KR) ................................ 2001-38717

(51) Int. Cl.
*H01L 23/02* (2006.01)

(52) U.S. Cl. ...................... 257/678; 257/666; 257/696; 257/695; 257/670; 257/676

(58) Field of Classification Search ................ 257/666, 257/678, 696, 695, 701, 703, 705, 706, 796, 257/670, 676, 787, 690; 438/123, 124; 357/70; 174/52.4

See application file for complete search history.

(56) References Cited

U.S. PATENT DOCUMENTS 4,855,807 A * 8/1989 Yamaji et al. .............. 257/670
5,014,113 A * 5/1991 Casto ........................ 174/52.4
5,249,354 A 10/1993 Richman
5,455,446 A * 10/1995 Suppelsa et al. ............ 257/467
5,648,682 A 7/1997 Nakazawa et al.
5,818,105 A * 10/1998 Kouda ........................ 257/695
6,104,084 A 8/2000 Ishio et al.
6,177,718 B1 * 1/2001 Kozono ...................... 257/666
6,198,171 B1 * 3/2001 Huang et al. ............... 257/787
2002/0113305 A1 * 8/2002 Huang ........................ 257/690

FOREIGN PATENT DOCUMENTS

EP 0677873 A1 10/1995
JP 62-147360 9/1987
JP 01-117350 5/1989
JP 02-022851 1/1990

(Continued)

OTHER PUBLICATIONS

English Translation of abstract for Japanese Patent No. JP3096264.

(Continued)

*Primary Examiner*—Minhloan Tran
*Assistant Examiner*—Tan Tran
(74) *Attorney, Agent, or Firm*—Marger Johnson & McCoolom, P.C.

(57) ABSTRACT

An ultra-thin semiconductor package includes a lead frame having a die pad and a plurality of leads surrounding the die pad. The die pad includes a chip attaching part to which a semiconductor chip is attached and a peripheral part integral with and surrounding the chip attaching part. The thickness of the chip attaching part is smaller than the thickness of the leads. The package device further includes bonding wires electrically connecting the chip to the leads, and a package body for encapsulating the semiconductor chip, bonding wires, die pad, and inner portions of the leads. A first thickness of the die pad is preferably between about 30–50% of a second thickness of the leads. An overall thickness of the package device is preferably equal to or less than 0.7 mm.

63 Claims, 13 Drawing Sheets

FOREIGN PATENT DOCUMENTS

| | | | |
|---|---|---|---|
| JP | 2002-022851 | | 1/1990 |
| JP | 3096264 | | 4/1991 |
| JP | 5-136323 | | 6/1993 |
| JP | 05-144869 | * | 6/1993 |
| JP | 07-335682 | | 12/1995 |
| JP | 8298306 | | 11/1996 |
| JP | 11-3970 | | 1/1999 |
| JP | 2000-124396 | | 2/2000 |
| JP | 2000-124396 | * | 4/2000 |

OTHER PUBLICATIONS

English Translation of abstract for Japanese Patent No. JP8298306.

English language abstract for Japanese Utility Model Publication No. 62-147360.

English Translation of Japanese abstract for publication No. 2002-022851 filed Jan. 25, 1990.

English Translation of Japanese abstract for publication No. 2000-124396 filed Feb. 28, 2000.

English language abstract of Japanese Publication No. 01-117350.

English language abstract of Japanese Publication No. 5-136323.

English language abstract of Japanese Publication No. 11-3970.

English language abstract of Japanese Publication No. 07-335682.

* cited by examiner

ULTRA-THIN SEMICONDUCTOR PACKAGE DEVICE AND METHOD FOR MANUFACTURING THE SAME

BACKGROUND OF THE INVENTION

1. Field of the Invention

This invention relates to semiconductor chip packaging technology, and more particularly to an ultra-thin semiconductor package and a method for manufacturing the same. This invention also relates to an electronic apparatus including an ultra-thin semiconductor package device.

2. Description of Related Art

In general, integrated circuit (IC) semiconductor chips such as memory chips are assembled in a package form and mounted on a circuit board of one of various electronic apparatuses. An interfacing structure is required to provide the electrical and physical interconnection between the IC chips and the circuit board. Lead frames are presently the most widely used interfacing structure in the semiconductor industry.

FIG. 1 is a cross-sectional view of a conventional IC device in which semiconductor chips are mounted on both sides of a lead frame in order to improve a mounting density of the package. This package structure is disclosed, for instance, in Japanese Unexamined Patent Publication No. 62-147360.

Referring to FIG. 1, a conventional semiconductor package 10 includes a die pad 13 and a lead frame having a plurality of leads 14. A semiconductor IC chip 11 is bonded to the die pad 13 by an adhesive 12. The semiconductor IC chip 11 is electrically interconnected to the leads 14 via bonding wires 16. The semiconductor IC chip 11 and bonding wires 16 are protected by a package body 17 made of an epoxy molding compound. Outer portions of the leads 14, which protrude from the package body 17, are bent in a form suitable for mounting the package onto a circuit board (not shown).

In the conventional semiconductor package 10, there is an increasing demand for thinner packages as smaller and lighter electronic apparatuses that employ package devices are developed. In particular, when two or more semiconductor chips 11 are stacked together in a single package body to increase memory capacity, a thinner package becomes even more important.

In order to make the semiconductor package thinner, reduction of the thickness of the semiconductor chip itself and reduction of the thickness of the lead frame have been considered. For instance, by applying a so-called wafer back lapping to a wafer, semiconductor chips can be made as thin as between 100 to 150 μm. Using chips having this range of thickness, the overall thickness of the package device can be reduced to less than 1 mm.

Unfortunately, however, since the wafer is made of low-hardness material such as silicon, reducing the thickness of the semiconductor chip makes handling of the wafer more difficult and increases the possibility of chip cracks or wafer warpage. As a result, there are inevitable limitations on decreasing the thickness of the semiconductor chip; especially considering that the demand for improving yield of semiconductor products has resulted in an increases in the diameter of wafers to about 12 inches.

Reducing the thickness of the lead frame also has disadvantages. For example, if the thickness of a lead frame is too small, the lead frame is very fragile, leading to a decrease in the productivity of the assembly process. Based on the need for handling lead frames and for forming outer leads, 100 μm is a known limit on the thinness of the lead frame.

Conventional instruments and plastic packaging machinery are widely used for packaging semiconductor devices. Unfortunately, however, when new assembly technologies such as CSP (Chip Scale or Size Package) technology are used to make the package device thinner, costs for replacing existing instruments and machinery are incurred.

SUMMARY OF THE INVENTION

An object of this invention is to provide an ultra-thin semiconductor package having a thickness preferably less than 1.0 mm, and more preferably less than 0.7 mm or 0.5 mm, while still improving the mounting density of the package device.

Another object of this invention is to provide a method of manufacturing an ultra-thin semiconductor package.

Another purpose of this invention is to produce an ultra-thin semiconductor package capable of using existing instruments for manufacturing a conventional plastic package to manufacture the ultra-thin semiconductor package of this invention.

Another object of this invention is to provide an ultra-thin semiconductor package having improved reliability through an easy to manage process.

According to the present invention, an ultra-thin semiconductor package includes a lead frame having a die pad and a plurality of leads surrounding the die pad. The die pad includes a chip attaching part to which the semiconductor chip is attached and a peripheral part, integral with and surrounding the chip attaching part. A first thickness of the chip attaching part is smaller than a second thickness of the leads. The package device also has a semiconductor IC chip, bonding wires electrically connecting the chip and each of the leads, and a package body for encapsulating the semiconductor chip, bonding wires, die pad and inner portions of the leads.

One of the advantages of the present invention lies in that the thickness of the die pad is smaller than the thickness of the leads. The die pad thickness is preferably equal to or less than 50%, and more preferably ranging between 30–50%, of the thickness of the leads. The overall thickness of the package device is preferably equal to or less than 0.7 mm.

According to one aspect of the present invention, an ultra-thin package device may comprise two semiconductor chips, wherein one chip is attached to each side of the die pad. At least two tie bars are connected to a die pad peripheral part. The tie bars have a third thickness which is equal to either the first thickness of the chip attaching part or the second thickness of the leads. The peripheral part may have the same thickness as either the chip attaching part or the leads. When the thickness of the peripheral part is made greater than that of the chip attaching part and identical to the lead thickness, the die pad has an approximately U-shaped cross-section.

When the direction of protrusion of the peripheral part faces downwards in a direction of the thickness of the package body, it is preferable to bend-down the tie bar so that the die pad is located centrally in the package body. Further, if the peripheral part protrudes upward in the package body, it is preferable to dispose the leads in an upper portion of the package body to obtain a balanced structure.

According to another aspect of the present invention, the die pad may be divided into first and second die pads each having its own tie bar, chip attaching part, and peripheral part. In this embodiment, the tie bar, chip attaching part, and the peripheral part all have the same thickness but are thinner than the leads.

According to another aspect of the present invention, a method of manufacturing an ultra-thin package device includes preparing a lead frame including a die pad, a tie bar, and a plurality of leads. The die pad is provided with a chip attaching part and a peripheral part surrounding the chip attaching part. The chip attaching part is etched to make it thinner. The amount of etching of the chip attaching part can be determined by a pressure and applying time of an etchant. The semiconductor chip is die bonded to the chip attaching part of the die pad. The semiconductor chip and leads are electrically interconnected through wire bonding. A package body is then formed by encapsulating the semiconductor chip, bonding wires, and inner portions of the leads. The package body is preferably formed at a low-temperature (i.e., under about 170–175° C.).

According to still another aspect of the present invention, a method of manufacturing an ultra-thin package device includes preparing a wafer having an active surface on which a plurality of semiconductor chips are formed. An adhesive layer is attached to the backside of the chip. A UV tape is attached to the adhesive layer. UV light irradiates the UV tape to remove the adhesiveness between the adhesive layer and the UV tape. The wafer is cut into a plurality of semiconductor chips. The cut chips are then completely separated from the wafer state UV tape. The adhesive layer remains attached to the backside of the individual chips.

Die bonding is accomplished through a series of steps. A semiconductor chip is attached to the top surface of the chip attaching part. A semiconductor chip is also attached to the bottom surface of the chip attaching part. The adhesive layer, which was attached to the backside of the chip in the wafer state, is used in die bonding.

Wire bonding proceeds by wire bonding the chip attached to the top surface of the chip attaching part and wire bonding the chip attached to the bottom surface of the chip attaching part. The wire bonding preferably uses a reverse wire bonding process in which balls are formed on the leads and stitches are formed on the chip electrode pads. It is further preferable that the length of bonding wire connected to the chip mounted on the top surface of the chip attaching part is different from the length of bonding wire connected to the chip mounted on the bottom surface of the chip attaching part. Specifically, it is desirable for a bonding wire connected to a chip having shorter a vertical distance to the leads to have a smaller length.

Applying the ultra-thin technology of this invention, it is possible to provide a stack package device having a thickness of 0.6 mm or less and a single chip package device having a thickness of 0.48 mm or less. These package devices can be widely used in various portable electronic apparatuses (such as memory cards, for example) that require packages with minimal vertical heights.

According to the present invention, it is possible to improve the physical reliability of an ultra-thin package device and to easily manage the assembly processes. Specifically, since the ultra-thin package device is obtained by making the die pad thinner, the reliability of the assembly process and the resultant package device is not affected. Furthermore, according to the preferred embodiments of this invention, there is no need to invest in additional equipment to manufacture the ultra-thin package device, since conventional machinery and instruments can be used to reduce the die pad thickness.

In addition, according to the package structure of the present invention, imperfect molding can be prevented by adjusting the vertical position of the die pad or forming an unbalanced package body. Moreover, since only the thickness of the chip attaching is reduced, while the other parts, including a peripheral part and a tie bar are not affected, the die pad supporting function of the tie bar is retained and the physical strength and reliability of the package device is maintained.

Further, when a die pad divided into at least two parts is employed, the area occupied by the die pad can be reduced. Degradation of reliability due to the mismatch of thermal coefficients of expansion among materials of the die pad and other elements can thereby be prevented.

The ultra-thin package device of the present invention is not limited by the type or number of semiconductor chips included in the package, nor by the type of adhesive used to attach the chip to the die pad. It is also possible to reduce the wire loop height of a package by adopting a reverse wire bonding approach.

BRIEF DESCRIPTION OF THE INVENTION

The foregoing and other objects, features, and advantages, will be more clearly understood from the following detailed description of preferred embodiments taken in conjunction with the accompanying drawings, in which.

Figure 1:
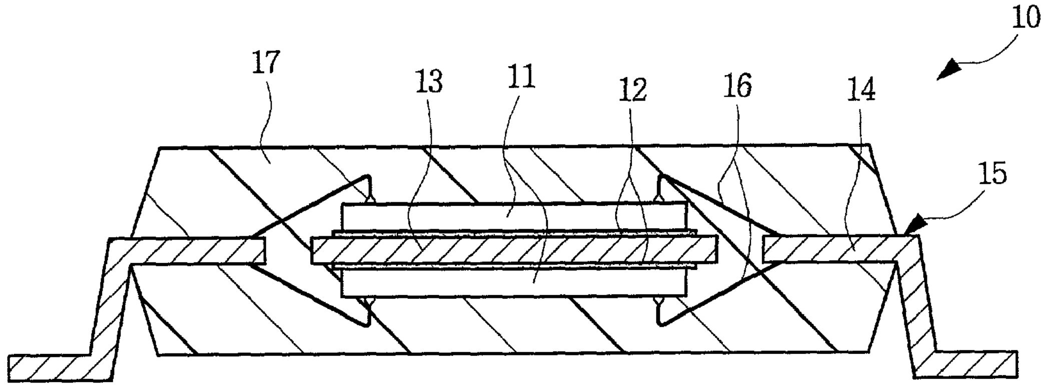
FIG. 1 is a cross-sectional view of a conventional semiconductor package device employing a lead frame.
Figure 2:
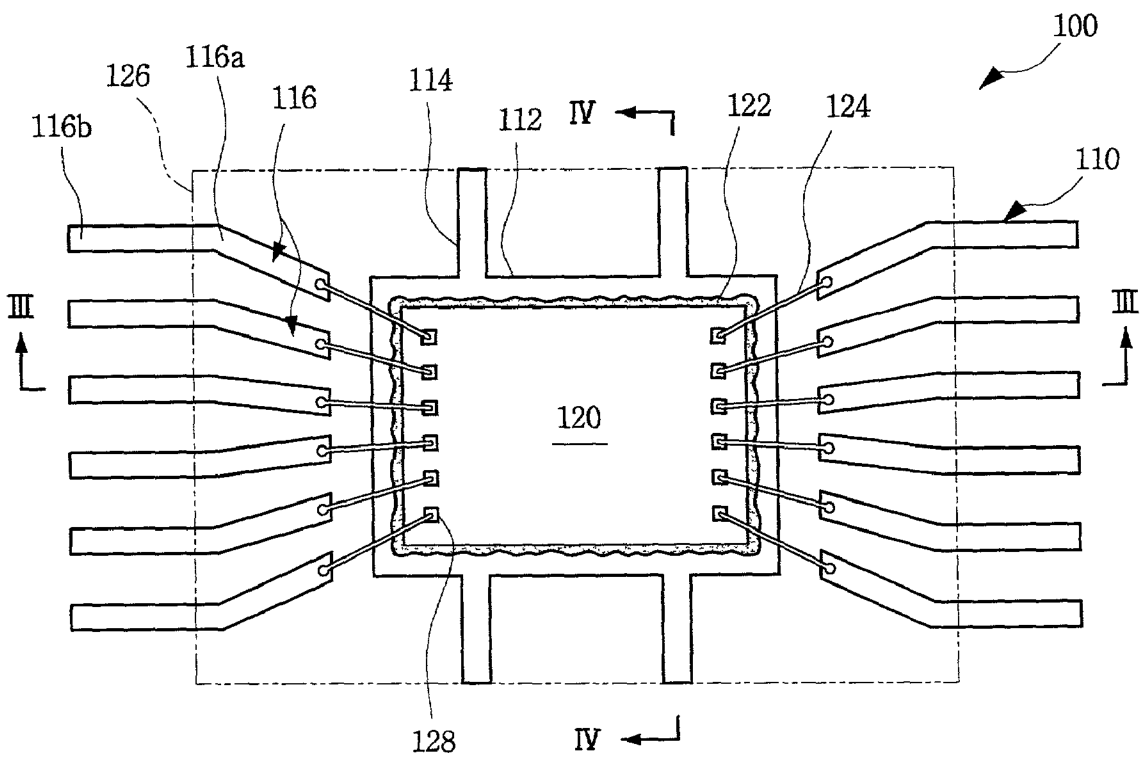
FIG. 2 is a plan view of an ultra-thin semiconductor package according to a first embodiment of the present invention.
Figure 3A:
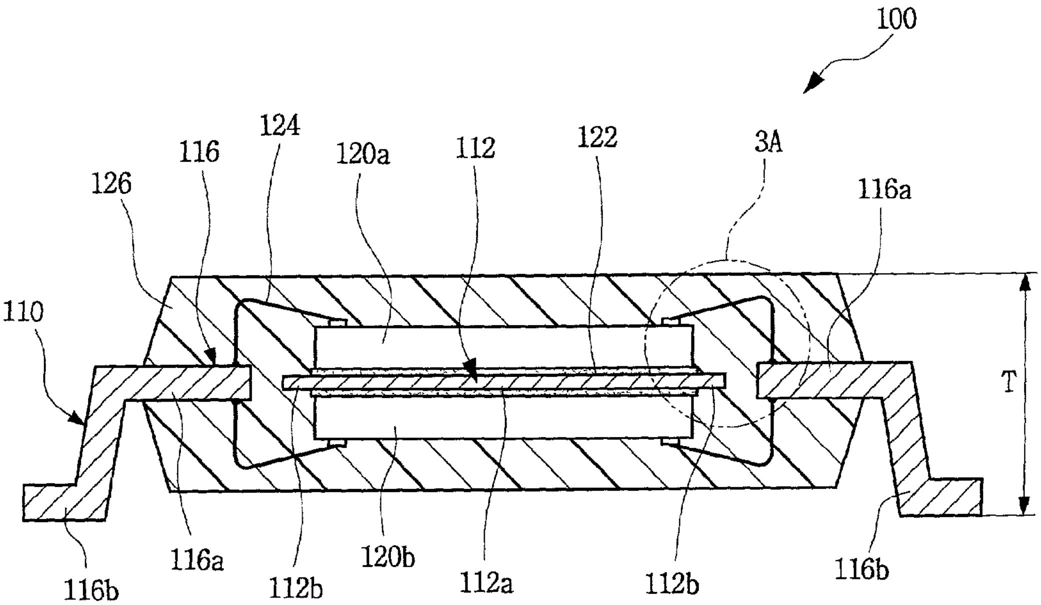
Figure 3B:
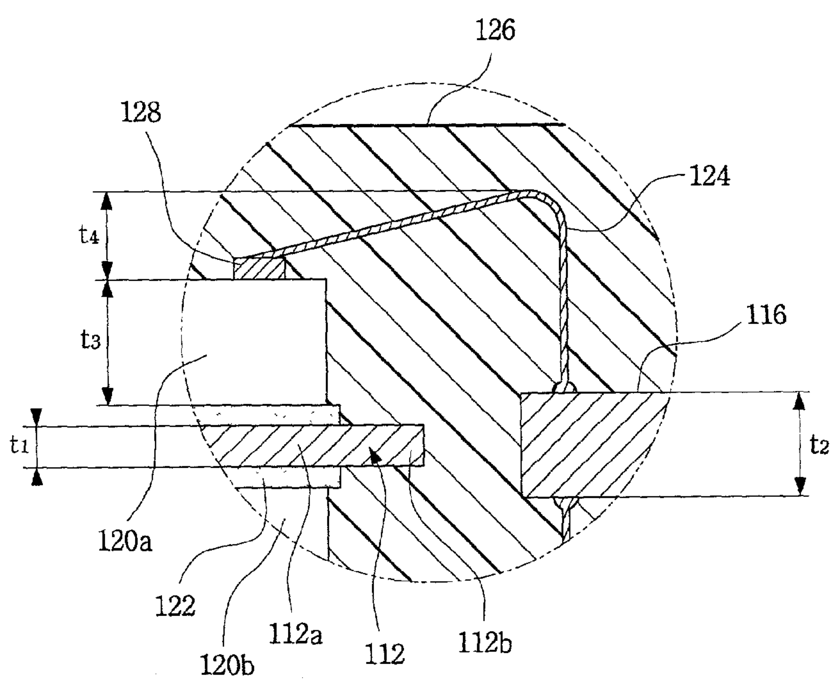

FIG. 3*a* is a cross-sectional view of the semiconductor package of FIG. 2 taken along a line III—III, and FIG. 3*b* is a partial detail view of the package of FIG. 3*a*.

Figure 4:
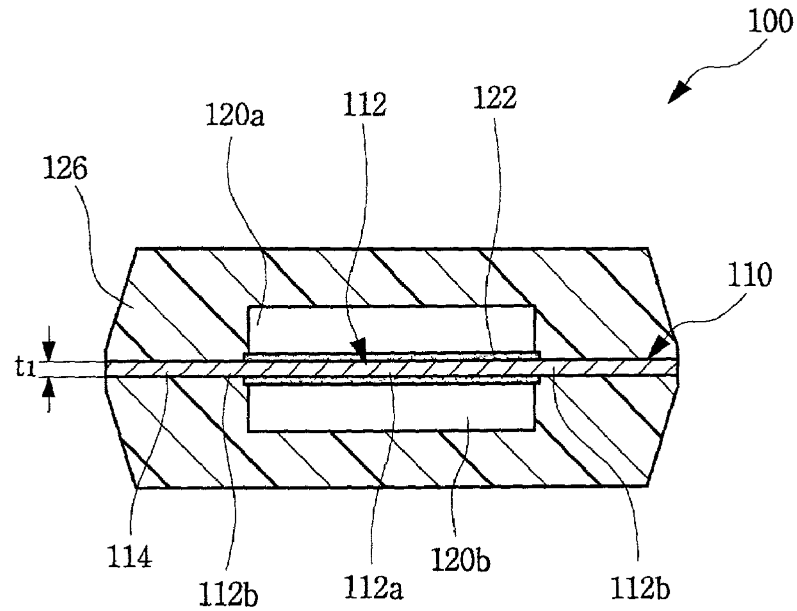

FIG. 4 is a cross-sectional view of the semiconductor package of FIG. 2 taken along a line IV—IV.

Figure 5:
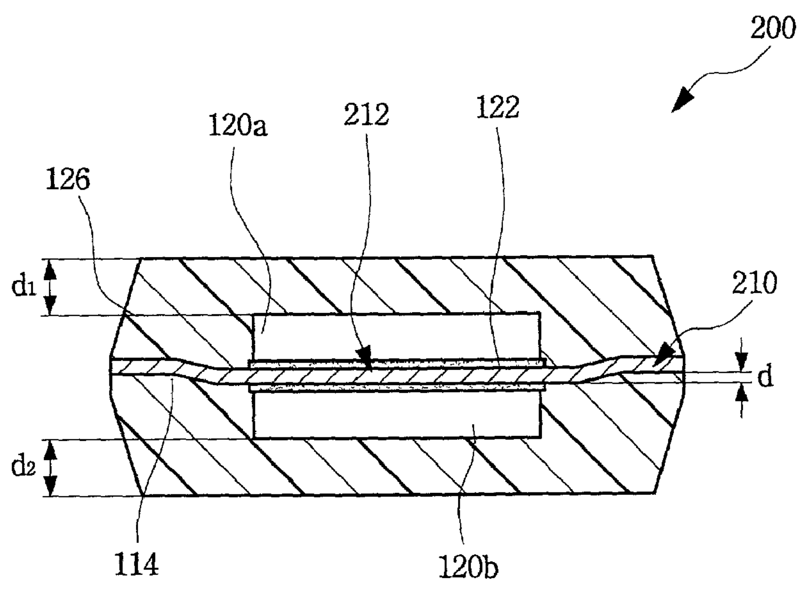

FIG. 5 is a cross-sectional view of an ultra-thin semiconductor package according to a second embodiment of the present invention.

Figure 6:
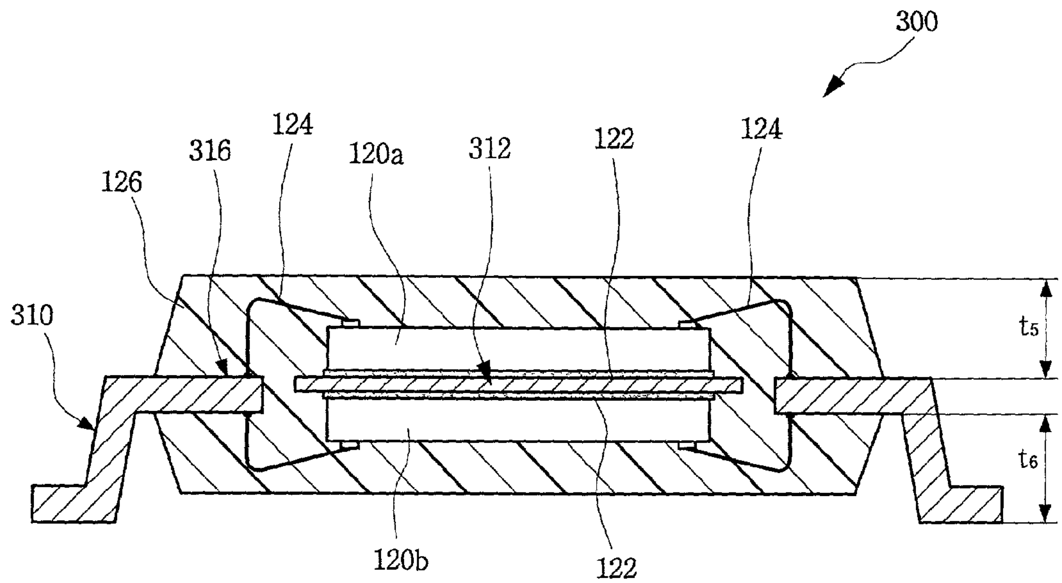

FIG. 6 is a cross-sectional view of an ultra-thin semiconductor package according to a third embodiment of the present invention.

Figure 7A:
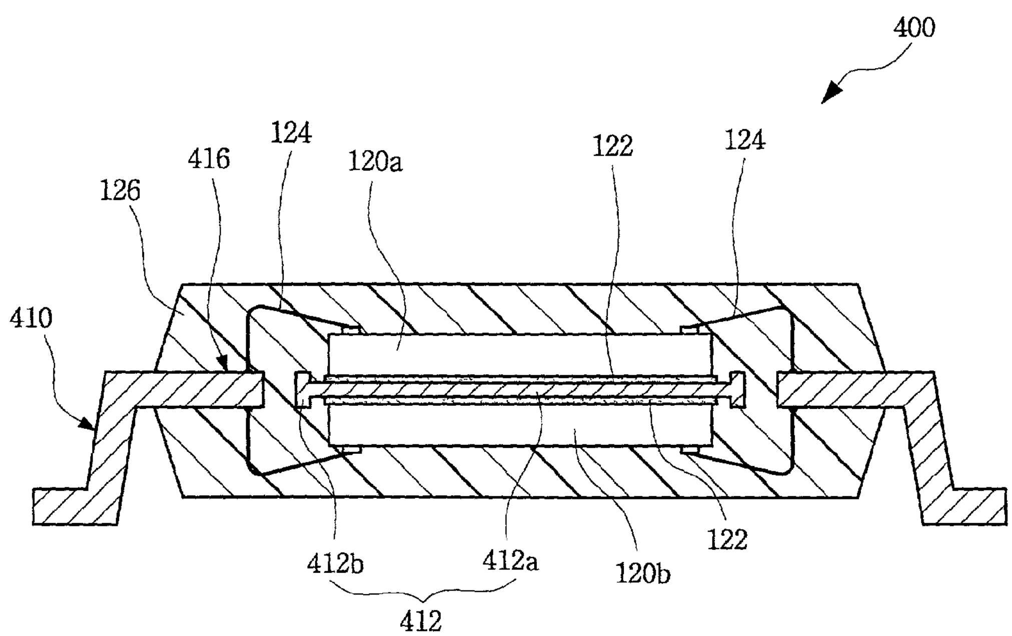
Figure 7B:
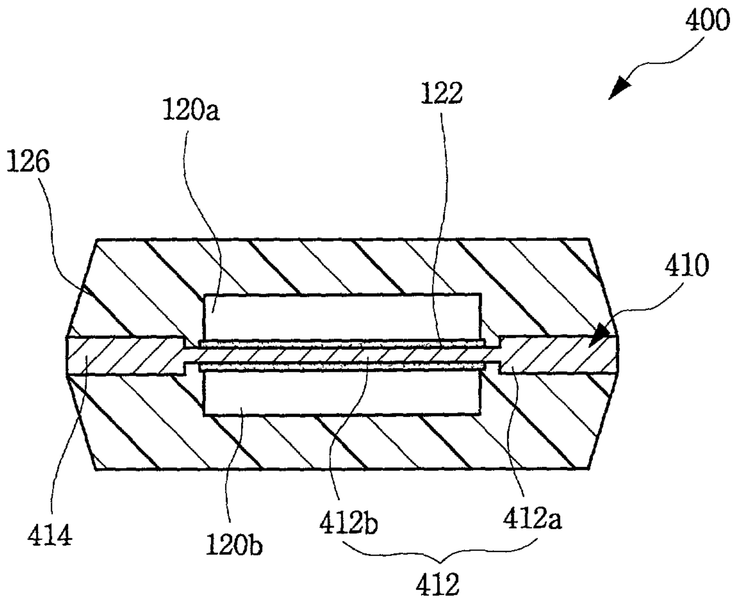

FIGS. 7*a* and 7*b* are cross-sectional views of an ultra-thin semiconductor package according to a fourth embodiment of the present invention.

Figure 8:
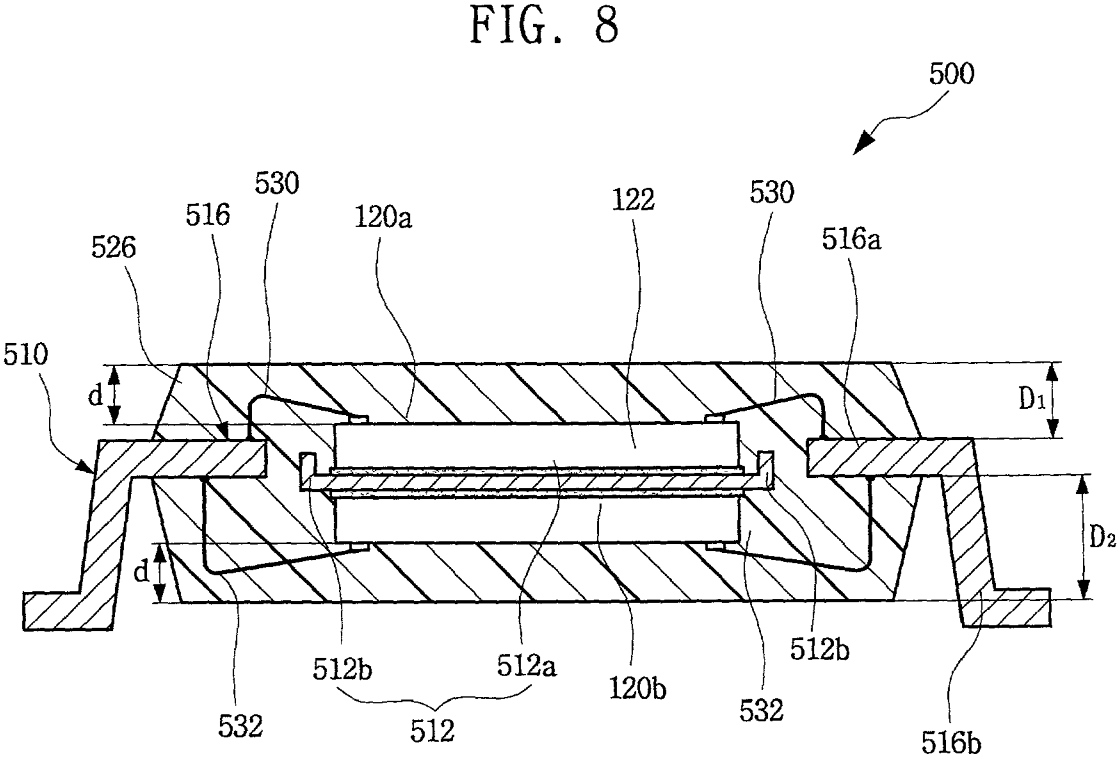

FIG. 8 is a cross-sectional view of an ultra-thin semiconductor package according to a fifth embodiment of the present invention.

Figure 9:
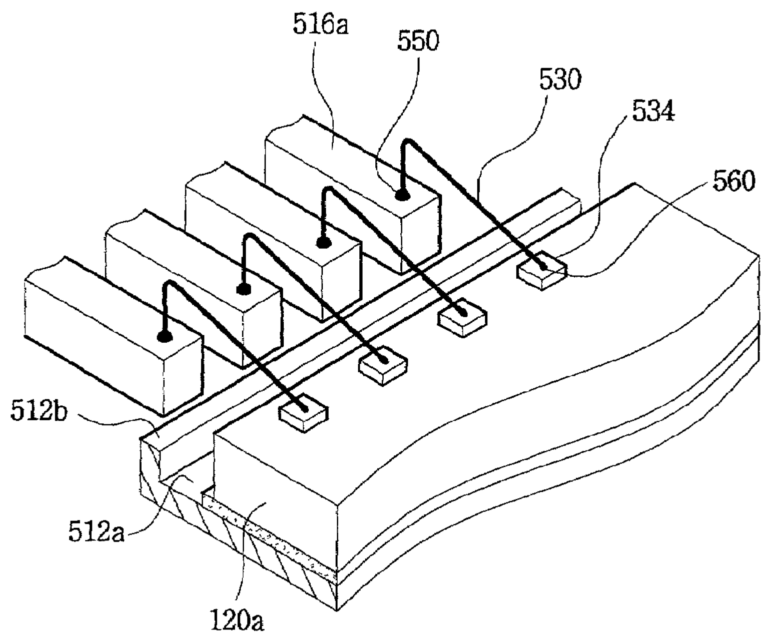

FIG. 9 is a partially detailed view illustrating a reverse wire bonding structure in an ultra-thin semiconductor package according to another aspect of the present invention.

Figure 10:
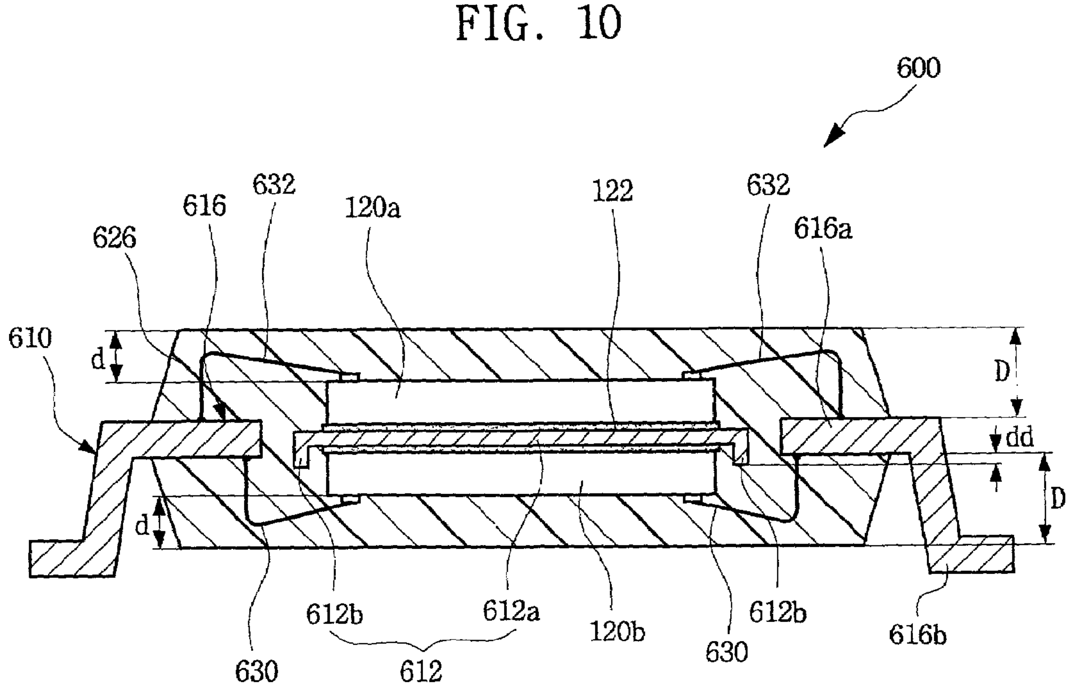

FIG. 10 is a cross-sectional view of an ultra-thin semiconductor package according to a sixth embodiment of the present invention.

Figure 11A:
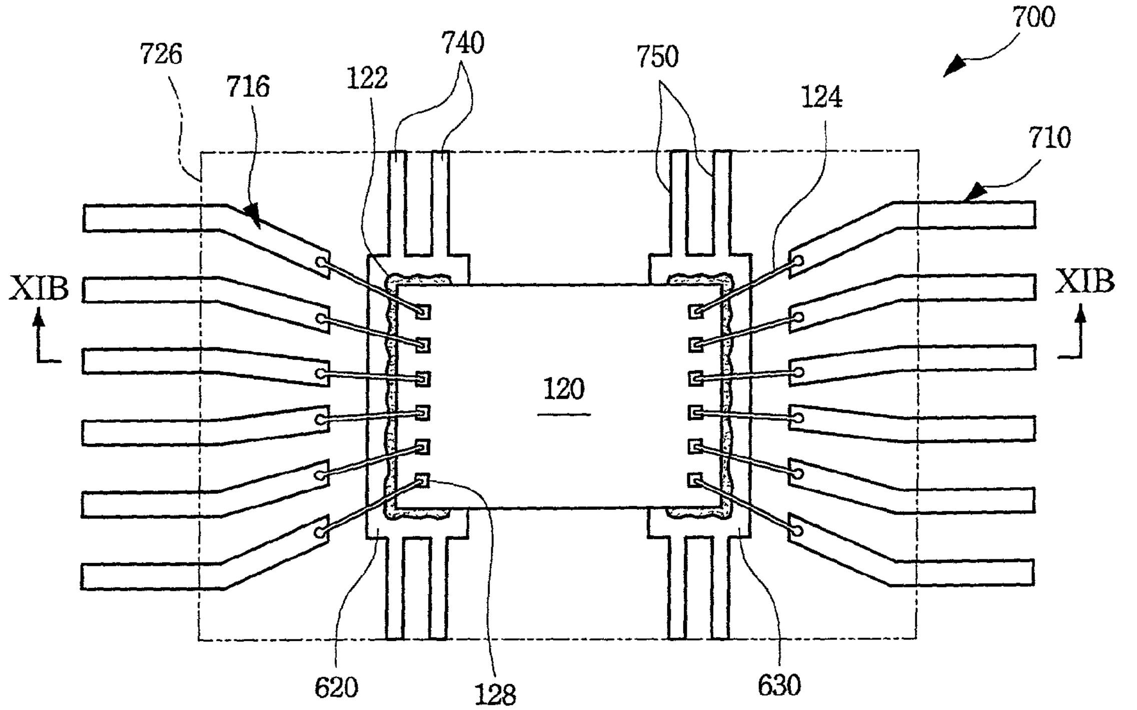
Figure 11B:
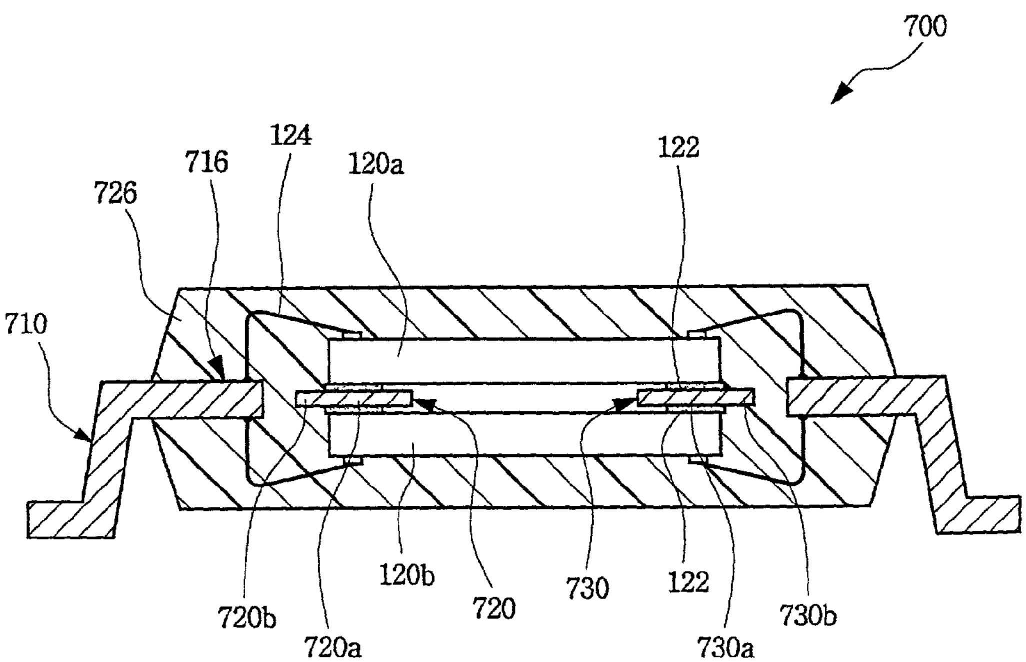

FIGS. 11*a* and 11*b* are, respectively, a plan view and a cross-sectional view of an ultra-thin semiconductor package according to a seventh embodiment of the present invention.

FIGS. 12*a* to 12*f* are cross sectional views of a lead frame illustrating a process for making a die pad of a lead frame partially thinner according to yet another aspect of the present invention.

FIGS. 13*a* to 13*i* are partial cross-sectional views illustrating a method of manufacturing an ultra-thin semiconductor package according to still another aspect of the present invention.

Figure 14A:
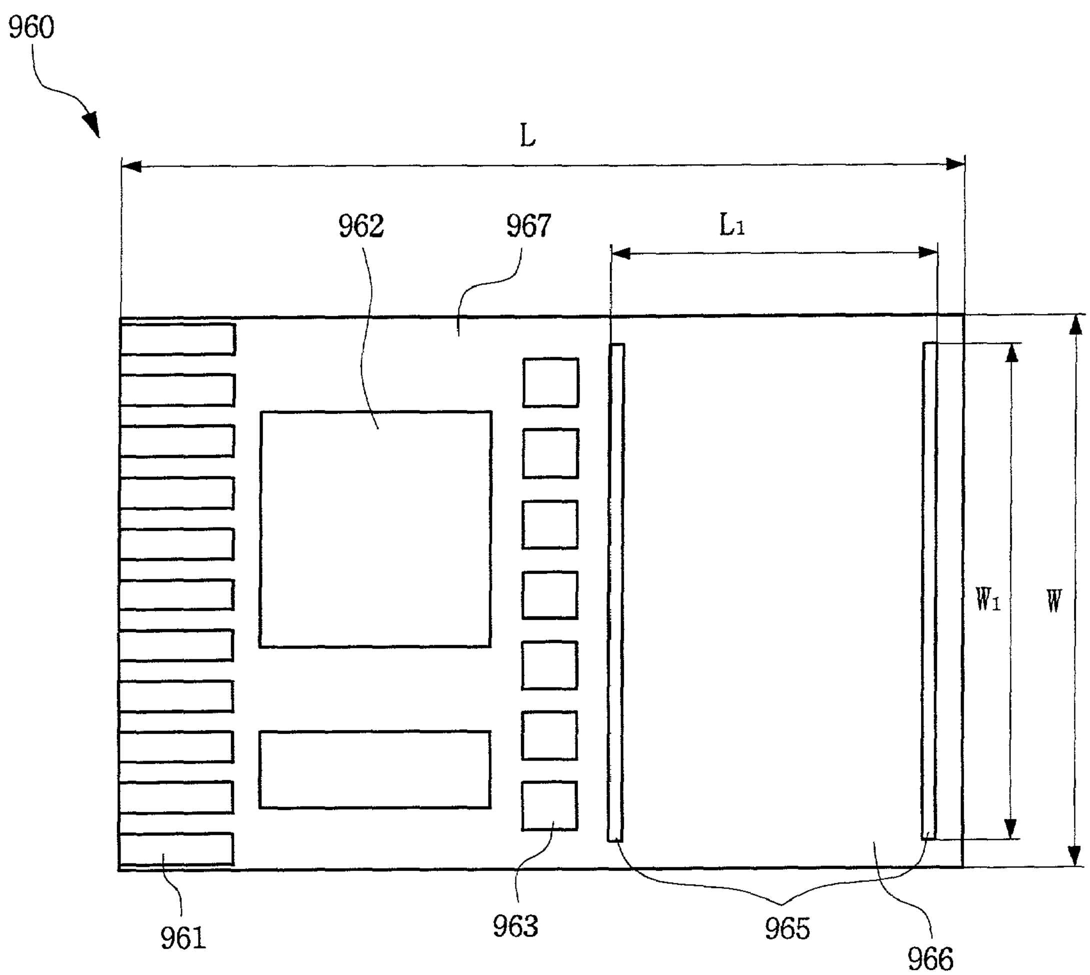
Figure 14B:
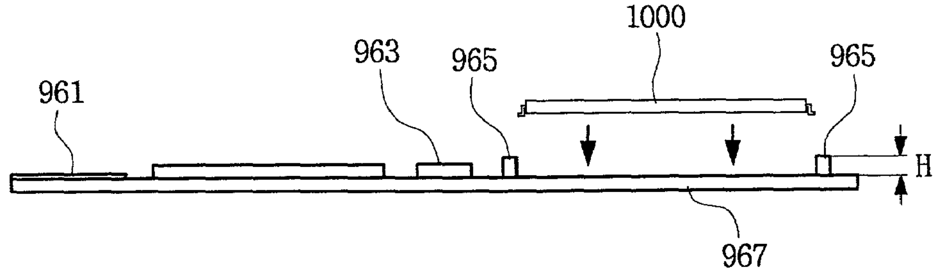

FIGS. 14*a* and 14*b* are, respectively, a plan view and a cross-sectional view of a memory card having an ultra-thin semiconductor package according to an embodiment of the present invention.

Figure 15:
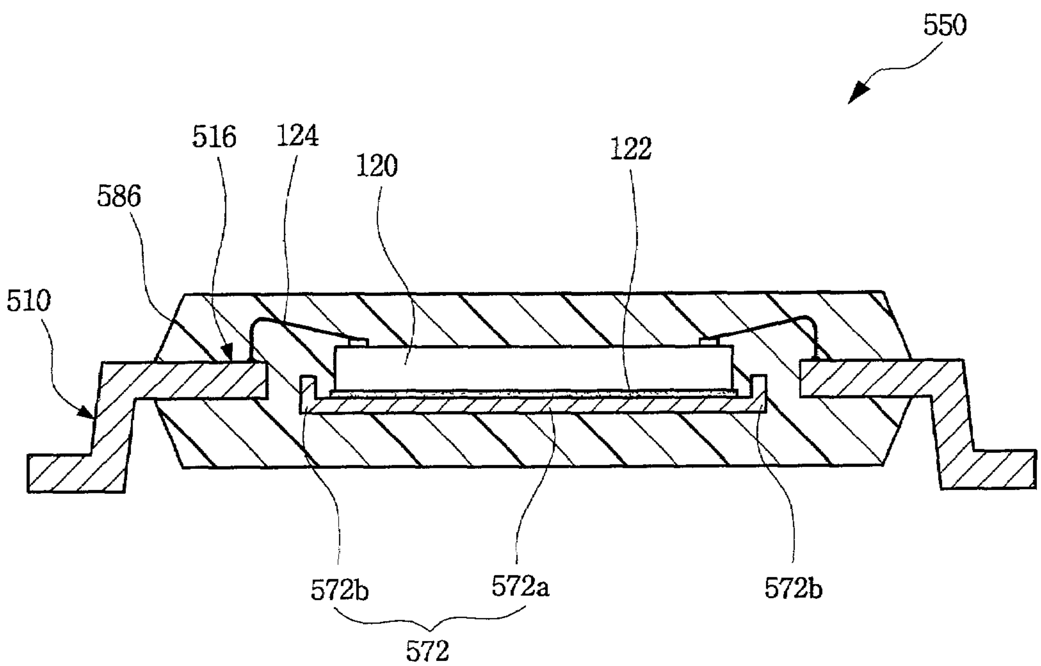

FIG. 15 is a cross-sectional view of a package device formed according to thin-packaging technology of the present invention.

Figure 16:
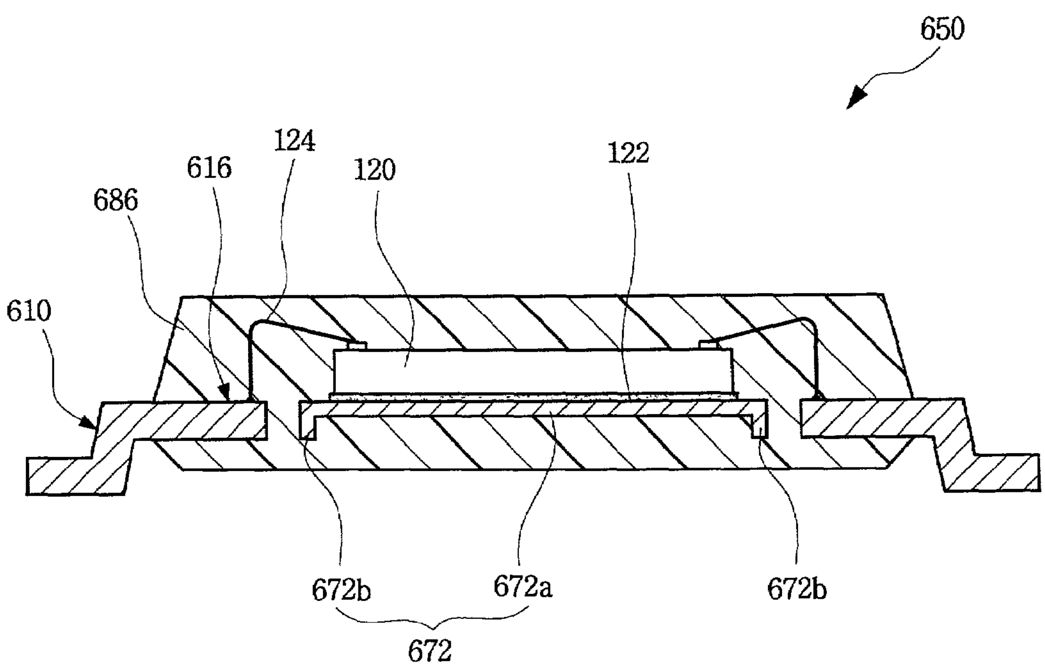

FIG. 16 is a cross-sectional view of another package device formed according to thin-packaging technology of the present invention.

DETAILED DESCRIPTION OF PREFERRED EMBODIMENTS

Ultra-thin semiconductor package configurations according to various aspects and embodiments of the present invention will now be described with reference to FIGS. 2 through 11.

First Embodiment

FIG. 2 is a partial plan view of an ultra-thin semiconductor package according to a first embodiment of the present invention. FIG. 3*a* is a cross-sectional view of the ultra-thin semiconductor package of FIG. 2, taken along line III—III. FIG. 3*b* is a partial detail view of the ultra-thin semiconductor package of FIG. 3*a*. FIG. 4 is a cross-sectional view of the ultra-thin semiconductor package of FIG. 2, taken along line IV—IV.

Referring to FIGS. 2 through 4, an ultra-thin semiconductor package 100 employs a lead frame 110 comprising a die pad 112, tie bars 114, and leads 116. The die pad 112 is located centrally in the package 100. A plurality of leads 116 and tie bars 114 are disposed around the die pad 112. The leads 116 are separated from the die pad 112, but are indirectly connected to the die pad 112 through the tie bars 114. The die pad 112 includes a chip attaching part 112*a* to which a semiconductor chip 120 is bonded, and a peripheral part 112*b* integrally formed with and surrounding the chip attaching part 112*a*.

Upper and lower semiconductor chips 120*a*, 120*b* are bonded to respective sides of the die pad 112. More specifically, an upper chip 120*a* is attached to an upper surface of the die pad chip attaching part 112*a*, while a lower chip 120*b* is attached to a lower surface thereof. The semiconductor chips 120 may, for example, be DRAMs, flash memories, or non-memory IC devices. The upper and lower chips may have the same functionality or they may be different chip-types, as desired. In order to increase the memory capacity of the package device, for example, the same memory chips may be employed on both the upper and lower surface of the chip attaching part 112*a*.

The upper and lower chips 120*a*, 120*b* are attached to the chip attaching part 112*a* of the die pad 112 via an adhesive layer 122. The adhesive layer 122 can be an epoxy such as an Ag-epoxy or an adhesive tape, such as a film type adhesive tape. The adhesive layer 122 is preferably a film type adhesive tape of epoxy resin, attached to the back of the chip in a wafer state. The semiconductor chip 120 is electrically interconnected to the leads 116 via bonding wires 124, which can be conventional gold wires.

The semiconductor IC chips 120, die pad 112, and bonding wires 124 are all encapsulated within the package body 126. The package body 126 is formed using an epoxy molding compound. During the manufacturing process for the package 100, the tie bar 114, which supports the die pad 112, is connected to the peripheral part 112*b* of the die pad 112 and remains within the package body 126. The leads 116, however, which provide an electrical and physical interface between the semiconductor package 100 and an external circuit board (not shown), have two portions. The first portion of the leads is the inner leads 116*a*, which are electrically interconnected to the semiconductor chips 120 via the bonding wires 124. The inner leads 116*a* remain within the package body 126. The second portion is the outer leads 116*b*, which are connected to the external circuit board. The outer leads 116*b* are located outside of the package body 126. The outer leads 116*b* are preferably bent and formed into a suitable shape, such as a Gull-wing shape, for mounting the package device 100 to the circuit board.

One of the advantages of various embodiments of the present invention lies in the fact that the thickness t1 of the chip attaching part 112*a* of the die pad 112 is smaller than the thickness t2 of the leads 116. The lead frame 110 used in the production of the package device 100 is conventionally made of copper or iron-nickel alloy (e.g., alloy 42). As explained below, the lead frame 110 is prepared from a thin metal plate, and the die pad 112, tie bar 114, and leads 116 are formed by etching or stamping the metal plate. Additional elements, including a dam bar and a side rail, are also formed by etching or stamping. These elements are not shown in the drawings, however, since they are not included in the final package device 100.

The lead frame 110 can have various thicknesses depending on the type of the package device 100. The lead frame thickness is being increasingly reduced according to the miniaturization trend in package devices. For example, lead frames traditionally having a thickness of 300 μm (12 mil), 250 μm (10 mil), 200 μm (8 mil), and 150 μm (6 mil) are currently being replaced with 100 μm (4 mil) lead frames. According to various aspects and embodiments of the present invention, even when a lead frame 110 having a thickness of about 100 μm is employed, the thickness of the die pad 112 (and particularly the chip attaching part 112*a*) can be made ultra-thin. For example, the thickness of the chip attaching part 112*a* can be reduced to between about 30–50% of the lead frame thickness. The thickness of leads 116 (t2) can be about 100 μm, while the thickness of the die pad 112 (t1) is about 40 μm. The tie bar 114 can have the same thickness as the die pad 112 (e.g., 40 μm). In this embodiment, the chip attaching part 112*a* of the die pad 112 has a substantially identical thickness with the peripheral part 112*b*.

By making the die pad 112 thinner, it is possible to reduce the overall thickness of the package device 100. In this embodiment, the thickness (T) of the package device 100 is about 0.58 mm. Referring specifically to FIG. 3*b*, the thickness of each of the adhesive layers 122 is between about 10–20 μm, the thickness (t3) of the semiconductor IC chip 120 is between about 100–150 μm, and the height (or loop height) (t4) of the bonding wires 124 from the upper surface of the chip 120 is about 80 μm.

The loop height of the bonding wire 124 affects the overall thickness of the package device. It is therefore preferable to use a reverse bonding method to connect the wires between the chip 120 and the leads 116. Reverse bonding is so named because it is performed in a manner opposite to the conventional wire bonding method. In the conventional method, wires are ball bonded to the chip electrode pads 128 and stitch bonded to the leads 116. In the reverse bonding method, the ball bonding is made on the leads 116 and the wires 124 are stitch bonded onto the chip electrode pads 128. In this manner, the wire height can be greatly reduced. For example, compared to the conventional value of about 150 μm, the wire height from reverse bonding is about half (80 μm). Metal bumps may be formed on the chip electrode pads 128 to alleviate the impact on the chip 120 during the wire bonding process.

The die pad 122 is made thinner by partially removing an upper side, lower side, or both, of the die pad 112 during the manufacturing process of the lead frame 110. This means that the die pad 112 is removed by a constant amount on one or both sides. As explained previously, the die pad 112 is supported by the tie bar 114 during the production process of the lead frame. Accordingly, even when a thinner die pad 112 is employed, the physical strength of the lead frame 110 is not significantly affected. Furthermore, existing equipment and processes for the production of the lead frame 110 can be used to produce the thinner die pad structure of the various embodiments of this invention.

The Second and Third Embodiments

In the preceding embodiment, the die pad 112 is partially removed on both sides. In the second and third embodiments, described below, only one side of the die pad 112 is partially removed. If the die pad 112 is partially removed on one side, the die pad 112 will not align with both the top and bottom surfaces of the leads 116. In other words, the die pad 112 will appear to be shifted away from a center of package body 126 in either an upward or downward direction. This causes an imbalanced package body 126 in relation to the active surface (the surface where the chip electrode pads are formed) of each of the upper and lower semiconductor chips 120*a* and 120*b*. This may result in incomplete molding of the package body 126.

Accordingly, when the die pad is partially removed on one side to make the die pad thinner, a procedure is necessary to attain a balanced die pad placement. The second and third embodiments address this problem. The second embodiment obtains a balanced structure by vertically adjusting the die pad location. The third embodiment of the present invention achieves balance by forming an asymmetrical package body structure. These embodiments will now be explained in further detail with reference to FIGS. 5 and 6, respectively.

Referring to FIG. 5, in the second embodiment of the present invention, a die pad 212 is disposed a predetermined distance 'd' below a tie bar 214. In other words, the die pad 212 is down-set from the horizontal top surface of the lead frame 210. Accordingly, even when one side of the die pad 212 is partially removed, the die pad 212 can be centered vertically in the package body 126. Therefore, a distance 'd1' from the active surface of the upper semiconductor chip 120*a* to the top surface of the package body 126 is equal to a distance 'd2' measured from the active surface of the lower semiconductor chip 120*b* to the bottom surface of the package body 126. The proper amount of down-set 'd' depends on the thickness of the chips, leads, die pad and package body and can be varied depending on whether the upper and lower semiconductor chips have the same or different thicknesses.

In the third embodiment of the present invention, described with reference to FIG. 6, the package body 126 is formed differently depending on the location of the die pad 312. In the conventional structure, the package body is formed having the same upper and lower thicknesses with respect to the lead. In the third embodiment of this invention, upper and lower parts of the package body 126 have the same thickness with reference to the die pad 312. The thickness 't5' of the upper part of the package body 126 with respect to the leads 316, however, is different than the thickness 't6' of the lower part of package body 126 with reference to the leads 316. In this way, the die pad 312 is located at the vertical center of the package body 126. Accordingly, when viewed in reference to the leads 316 of the lead frame 310, an unbalanced molding is formed. This unbalanced body structure can be obtained by forming cavities of upper and lower molds having different sizes.

The Fourth Embodiment

A fourth embodiment of the present invention will now be described with reference to FIGS. 7*a* and 7*b*, which provide cross-sectional views of the ultra-thin package device according to this embodiment.

A tie bar has the same thickness as the die pad peripheral part. The peripheral part of the die pad may have the same thickness as either the die pad chip attaching part or the leads. Whether the thickness of the peripheral part matches the chip attaching part or the leads is determined by whether the peripheral part and tie bar is partially removed along with the die pad chip attaching part.

In the first embodiment, the peripheral part 112*b*, the tie bar 114, and the chip attaching part 112*a* all share the same thickness. In this embodiment, however, the peripheral part 412*b* and tie bar 414 have the same thickness as the leads 116.

Referring to FIGS. 7*a* and 7*b*, a die pad 412 comprises a chip attaching part 412*a*, to which semiconductor chips 120 are attached, and a peripheral part 412*b*, which is connected to a tie bar 414. The chip attaching part 412*a* is made thinner by partially removing the die pad on the chip attaching part. The peripheral part 412*b* and the tie bar 414 are not removed. Accordingly, apart from the chip attaching part 412*a*, all of the remaining parts of the lead frame 410, including the peripheral part 412*b*, tie bar 414, and leads 416, have the same thickness. The chip attaching part 412*a* of the die pad 412 therefore provides the primary contribution to the thinning of the package 400. Further, although the die pad is thinner, because the thickness of the tie bar 414 and the peripheral part of the die pad 412 remain unchanged, the supporting ability is unaffected.

The Fifth Embodiment

FIGS. 8 to 10 show a stack package device having a die pad thickness made different from a lead thickness by partially removing one side of the die pad, according to a fifth embodiment of the present invention. Referring to FIG. 8, a stack package device 500 includes upper and lower semiconductor chips 120*a* and 120*b* attached, via an adhesive 122, to respective upper and lower sides of a die pad chip attaching part 512*a*. A peripheral part 512*b* of the die pad 512 is thicker than the chip attaching part 512*a* but has the same thickness as the inner leads 516*a*. The thickness of the chip attaching part 512*a* is preferably about 30–50% of the thickness of the peripheral part 512*b*. As a result, the die pad 512 has a cross-section having an approximate "U" shape, in which the protruding portions 512*b* at the ends point upward.

In the package body forming process, a vertically balanced structure with respect to the die pad is desirable. To accomplish this during the injection molding process, the upper thickness 'D1' and the lower thickness 'D2' of the package body 526 are made different with reference to the inner leads 516*a* to maintain an equal distance 'd' from the top and bottom surfaces of the package body 526 to upper and lower semiconductor chips 120*a* and 120*b*, respectively. For example, assuming the thickness of the package body 526 is 580 μm, the thickness of the upper and lower chips 120*a*, 120*b* is 120 μm, the thickness of the adhesive is 20 μm, the thickness of the inner leads 516*a* is 100 μm, and the thickness of the die pad chip attaching part 512*a* is 40 μm;

then the upper thickness 'D1' should be made equal to 205 μm and the lower thickness 'D2' should be made equal to 275 μm, so that the common distance 'd' is 135 μm.

As shown in FIG. 9, the semiconductor chips 120*a*, 120*b* are electrically interconnected to the inner leads 516*a* via bonding wires 524 using a reverse bonding technology. The reverse bonding wires 524 include balls 550 bonded to the surface of inner leads 516*a* and stitches 560 bonded to the electrode pads 534 of the semiconductor chips 120. The balls 550 and stitches 560 are formed by a capillary, as used in the conventional wire bonding process. Since there is no ball on the electrode pads 534, no loop is required on the pads. Instead, the wire loop is required on the balls 550 bonded to the inner leads 516*a*. However, since the inner leads 516*a* are located more towards the center of package body 526 than the active surfaces 540 of the upper and lower chips 120*a*, 120*b*, the wire loop has little or no effect on the thickness of the package body 526.

It is also preferable to make the bonding wires 530 bonded to the upper semiconductor chip 120*a* shorter than the bonding wires 532 connected to the lower chip 120*b*. Bondability of the bonding wires 530 and 532 is proportional to the vertical distance between the chip electrode pads and the leads (because of the margin for the wire loop height), and inversely proportional to the horizontal distance between the chip electrode pads and the leads. By shortening the wires 530 connected to the leads 516*a* having a smaller vertical distance to the upper chip 120*a*, bondability is enhanced.

The Sixth Embodiment

In the stack package structure 600 of FIG. 10, according to a sixth embodiment of the invention, different die pad and lead thicknesses are obtained by partially removing one side of the die pad 612*a*, as the fifth embodiment. Also similar to the fifth embodiment, the die pad chip attaching part 612*a* has a thickness of approximately 30–50% of the thickness of the die pad peripheral part 612*b* and the inner leads 616*a*, which share the same thickness.

Unlike the fifth embodiment, however, the protruding portions of the die pad peripheral part 612*b* extend downwards giving the cross-section of this embodiment an approximate inverted "U" shape. A vertically balanced structure with reference to the die pad in this embodiment is obtained by down-setting the tie bar. In other words, the die pad is disposed a predetermined distance 'dd' below the tie bar.

As an example, a package body 626 has a thickness of 580 μm. The thickness of the upper and lower semiconductor chips 120*a*, 120*b* is 120 μm. The thickness of the adhesive 122 is 20 μm. The thickness of the inner leads 616*a* is 100 μm. And the thickness of the chip attaching part 612*a* is 40 μm. To make both the distance 'd' from the upper semiconductor chip 120*a* to the top surface of the package body 626 and the distance 'd' from the lower chip 120*b* to the bottom surface of the package body 626 equal to 135 μm, the amount of the down-set 'dd' is 25 μm. In this embodiment, upper and lower portions of the package body 626 have the same thickness 'D' with reference to the inner leads 616*a* and thereby provide a vertically balanced structure with reference to the die pad 612.

In this embodiment, as shown in FIG. 10, the bonding wires 632 connected to the upper chip 120*a* are preferably made longer than the wires 630 bonded to the lower chip 120*b*. This is partly because of the difference in chip supporting structures during the first and second wire bonding processes and partly to improve the wire bondability.

The Seventh Embodiment

According to a seventh embodiment of this invention, the die pad can be divided into at least two portions. FIGS. 11*a* and 11*b* provide a plan view and cross-sectional view, respectively of an ultra-thin package device 700 in accordance with this embodiment.

Referring to FIGS. 11*a* and 11*b*, a die pad 712 is divided into two sub-pads; a first die pad 720 and a second die pad 730. The die pad 712 could be further divided, if necessary. The divided first and second die pads 720, 730 are supported by associated tie bars 740, 750, respectively. Semiconductor chips 120*a*, 120*b* are attached to upper and lower surfaces of each of the first and second die pads 720, 730 via adhesive layers 122.

Using the divided die pads 720, 730 of this embodiment, the semiconductor IC chips can be supported while reducing the area occupied by the die pad in the package body 726. As a result, degradation of the reliability of the package device (e.g., delamination or cracking of the package body) can be substantially reduced. This is because the mismatch of Coefficients of Thermal Expansion (CTEs) between the die pad and remaining elements (such as package body 726, semiconductor IC chip 120, and the adhesive layer 122) can be significantly prevented. Alternatively, the ultra-thin package device of the present invention may use a smaller die pad than the IC chip rather than, or in addition to, the plurality of divided die pads to obtain this benefit.

The first and second die pads 720, 730 of the package device 700 in the seventh embodiment of the present invention include chip attaching parts 720*a*, 730*a* and peripheral parts 720*b*, 730*b*, respectively. The thickness of the chip attaching parts 720*a*, 730*a* is about 30–50% of the thickness of leads 716. Also, although FIGS. 11*a* and 11*b* show identical thicknesses of the die pad peripheral parts 720*b*, 730*b* and the chip attaching parts 720*a*, 730*a*, it is also possible to make the thickness of the peripheral parts the same as the thickness of the leads, similar to the fourth through sixth embodiments.

Method for Manufacturing the Ultra-Thin Package

A method for manufacturing ultra-thin package devices according to another aspect of the present invention will now be explained with reference to FIGS. 12 and 13. FIGS. 12*a* to 12*f* are cross-sectional views illustrating the process of partially removing the lead frame die pad. The process shown in these figures is directed toward the package device structure of the fifth and sixth embodiments, wherein the die pad peripheral part protrudes away from the chip attaching part. It should be noted, however, that this process can be modified and revised to form any of the package structures described previously. Other modifications will also be apparent to those skilled in the art.

Figure 12A:
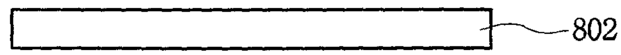

In this process, a strip of sheet metal for a lead frame, which forms the backbone of the package device is prepared. The lead frame serves as a holding fixture during the assembly process and after forming the package body, it becomes an integral part of the package. FIG. 12*a* shows a die pad area 802 of the lead frame. The die pad 802 preferably has a thickness of about 100 μm.

Figure 12B:
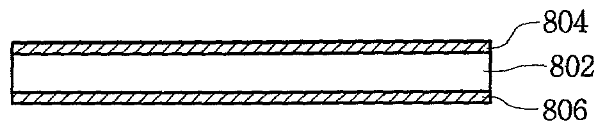
Figure 12C:
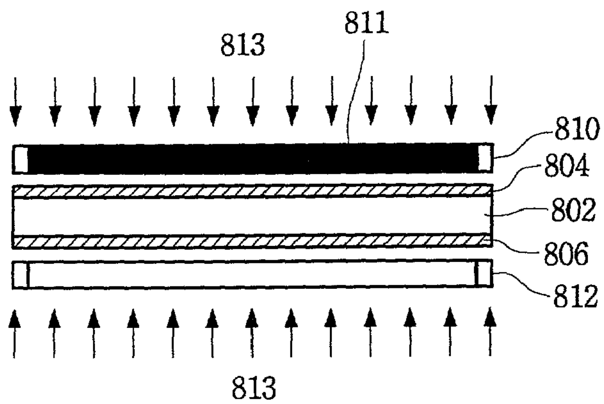

Referring to FIG. 12*b*, photoresists 804, 806 having a thickness of about 7.0±1.0 μm are deposited on each side of the die pad area 802. Referring to FIG. 12*c*, masks 810, 812 are aligned above and below the die pad area 802 deposited with the photo-resistors. The masks 810, 812 are then exposed to light 813 to transfer the mask patterns to the lead frame. The masks have predetermined patterns including black patterns 811 for reflecting the light and white patterns for transmitting the light.

Figure 12D:
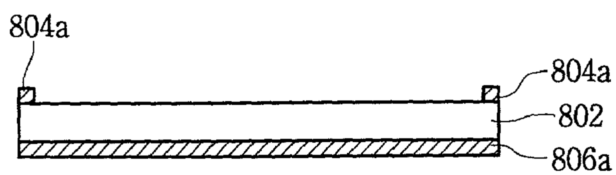
Figure 12E:
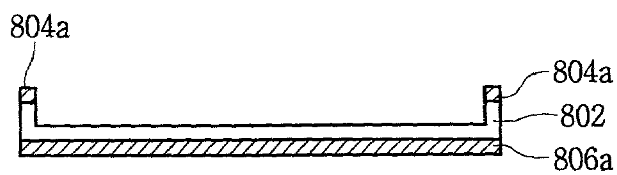

The exposed structure is developed and etched to remove the parts of the photoresist that the light did not reach. Chromium (Cr) is then applied to the remaining parts to form the structure shown in FIG. 12*d*. Referring to FIG. 12*d*, peripheral photoresist patterns 804*a* on the upper surface of the die pad area 802 and photoresist patterns 806*a* on the lower surface of the die pad area 802 are provided. Referring to FIG. 12*e*, this structure is then etched by spraying an etchant onto the die pad or by dipping the die pad into an etchant solution to partially remove the exposed part from the photoresist patterns 804*a*, 806*a*. When partially removing the die pad area 802, the amount of etching depends on factors such as pressure and spraying or dipping time.

Figure 12F:
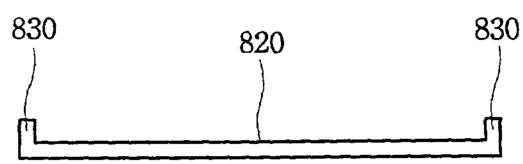

Referring next to FIG. 12*f*, when the photoresist patterns are removed, a die pad structure is obtained that has a chip attaching part 820 that is thinner than the peripheral part 830 is obtained. Since the other parts of the lead frame, including inner leads, outer leads, and tie bars, are not etched, they have the same thickness as the die pad peripheral part 830.

Figure 13A:
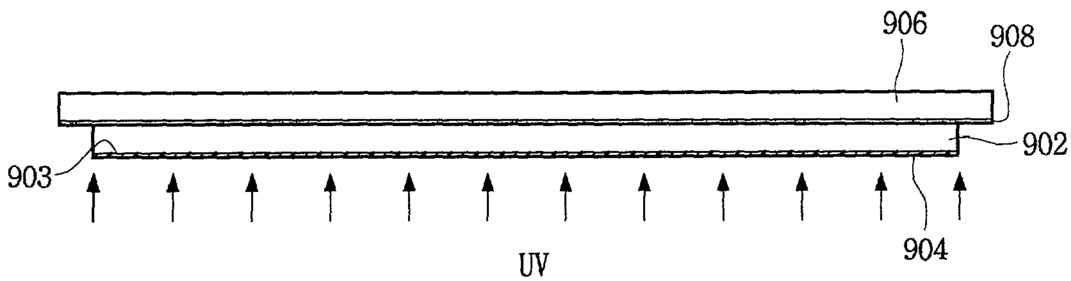

FIGS. 13*a* to 13*i* are cross-sectional views illustrating the process for packaging an ultra-thin semiconductor chip onto a lead frame produced by the process explained above with reference to FIGS. 12*a* to 12*f*. Referring to FIG. 13*a*, a wafer 902 is prepared by a semiconductor fabrication process. The wafer 902 has a plurality of IC devices. A UV adhesive tape 904 is adhered to the active surface 903 of the wafer 902. The UV tape 904 has near zero adhesion following UV irradiation, thereby permitting virtually no stress tape removal without adhesive residue. The UV tape 904 attached to the active surface 903 of the wafer 902 also has excellent shock and vibration absorption to protect the wafer 902 against breakage and damage during a pre-process such as back-grinding. An adhesive UV tape 906 that loses adhesiveness after UV irradiation is indirectly attached to the back surface (opposite the active surface) of the wafer 902 after grinding via an additional adhesive layer 908. The adhesive layer 908 is preferably a film type adhesive made of an epoxy resin, and includes a hardener (e.g., amine) and a coupling agent (e.g., silane).

Figure 13B:
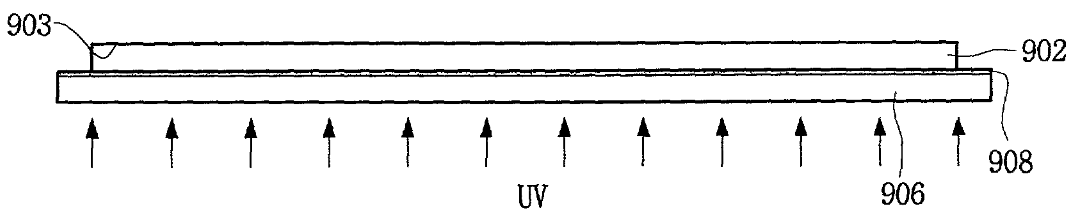

Referring to FIG. 13*a*, a first UV irradiation step can be performed on the active surface 903 of the wafer 902 using a UV lamp. The adhesive tape 904 attached to the active surface 903 thereby loses its adhesiveness and can be removed with no adhesive residue and without damaging the wafer 902. This first UV irradiation step is optional. As shown in FIG. 13*b*, a second UV irradiation step is performed on the backside of the wafer 902. The adhesive UV tape 906 thereby loses its adhesiveness to the adhesive layer 908 and can then be easily removed from the layer 908.

Figure 13C:
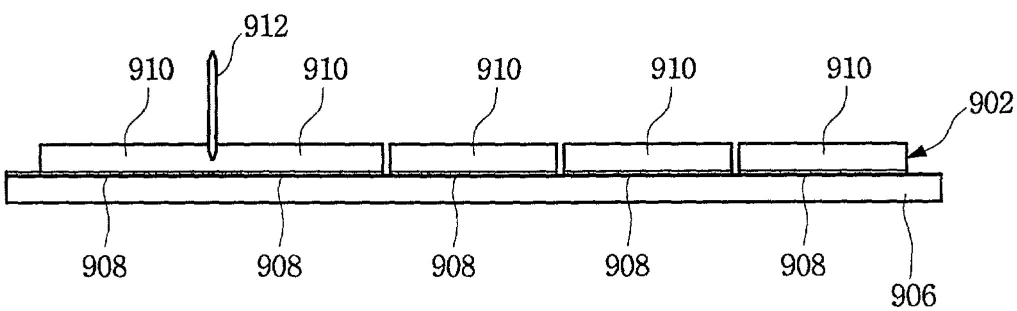

At this point, as shown in FIG. 13*c*, the wafer is cut and separated into individual chips 910 during a wafer sawing step by scribing the wafer 902 using a cutting means 912 such as a diamond wheel. Since the adhesive layer 908 and the adhesive UV tape 906 are attached to the back side of each chip 910, each of the chips 910 maintains the general cross-sectional structure of the wafer 902 when separated.

Figure 13D:
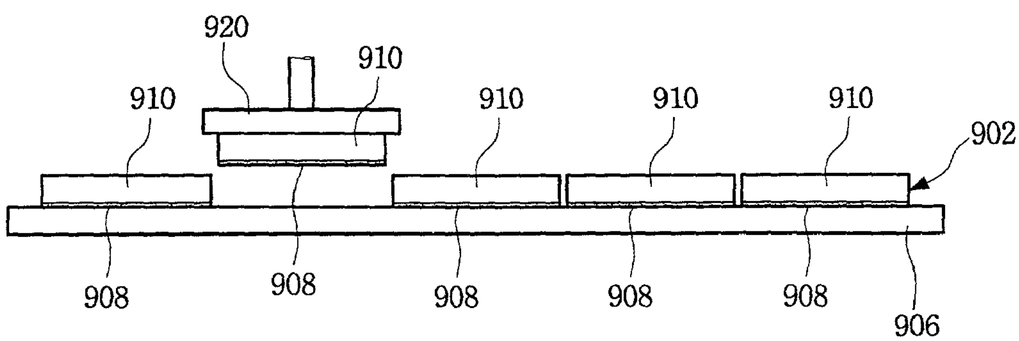

Referring FIG. 13*d*, the individual chips 910 are completely separated from the wafer using a vacuum pickup means 920 (die pickup step). Because the UV tape 906 loses its adhesiveness to the adhesive layer 908, the individual chips 910 can be easily separated from the tape 906. The adhesive layer 908, however, remains attached to the back side of the separated chips 910.

Figure 13H:
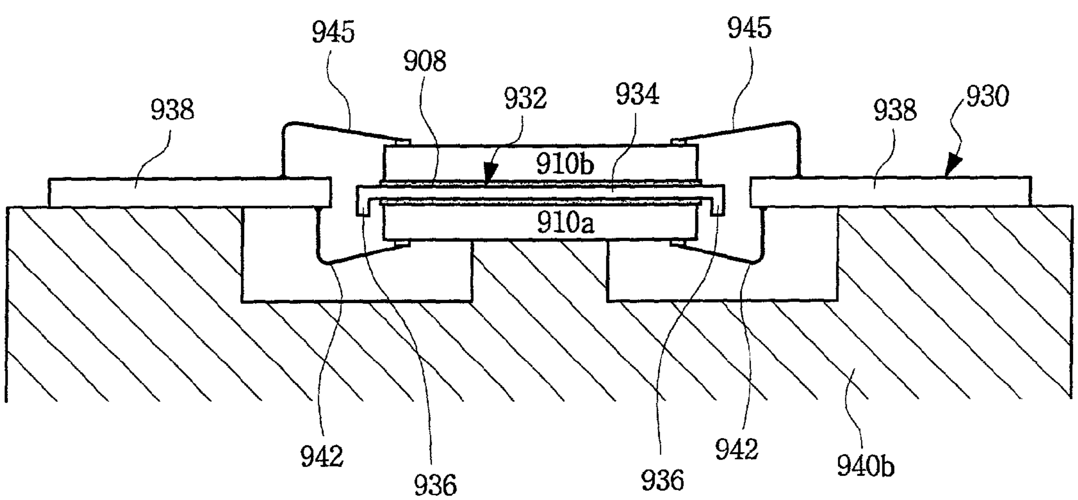
Figure 13I:
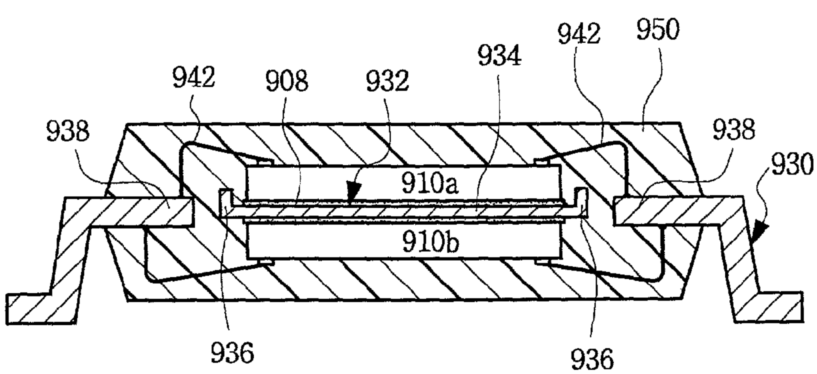
Figure 13E:
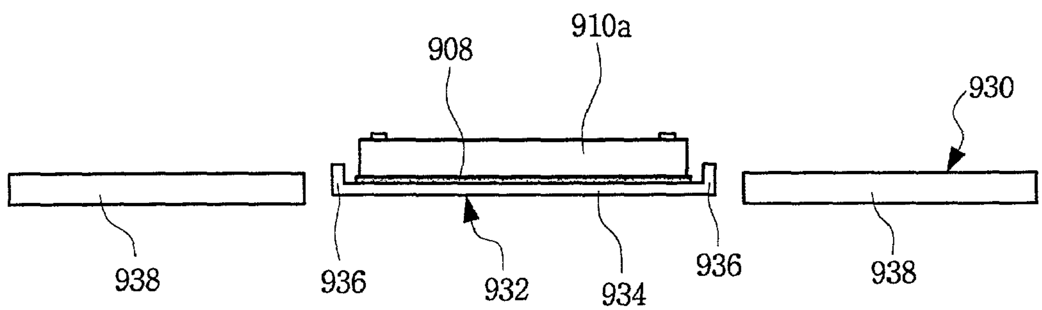

Referring FIG. 13*e*, in the first die bonding step, each chip 910 is attached to a die pad 932 of a lead frame 930 produced according to the process of FIGS. 12*a* through 12*f*. The lead frame 930 includes the die pad 932 and leads 938. The die pad 932 includes a chip attaching part 934 and a peripheral part 936. The peripheral part 936 protrudes from the chip attaching part 934 and has the same thickness as the leads 938. The thickness of the chip attaching part 934 preferably ranges between about 30–50% of the thickness of the peripheral part 936.

The chip bonded to the top surface of the chip attaching part 934 is called an upper chip 910*a*. In this case, the top surface of the chip attaching part 934 is the side located in the direction of protrusion of the peripheral part 936. Since the adhesive layer 908 remains on the back side of the upper chips 910*a*, there is no need to perform an additional adhesive applying step before die bonding the upper chip 910*a*.

Figure 13F:
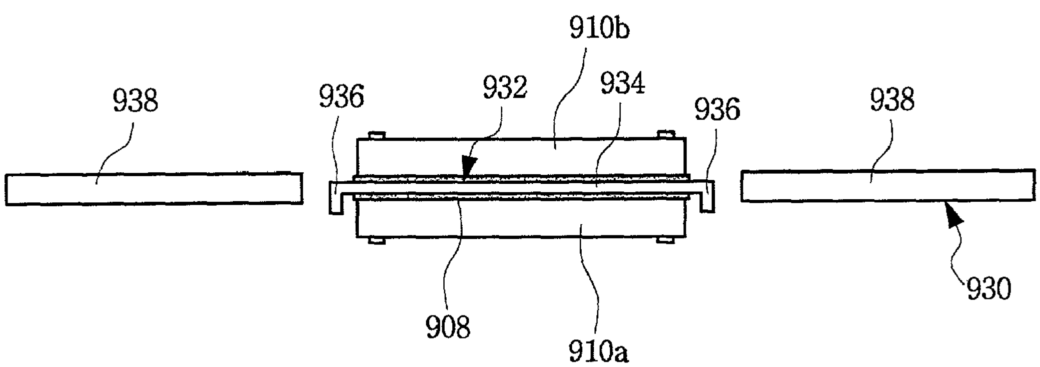

Next, as shown in FIG. 13*f*, a second die bonding step is performed in which a lower chip 910*b* is attached to the bottom surface of the chip attaching part 934. Since the lower chip 910*b* also has an adhesive layer 908 on its back side, the second die bonding step can also be accomplished without an additional adhesive applying step. In the first and second die bonding processes, the order of bonding of the upper and lower chips is not significant.

Figure 13G:
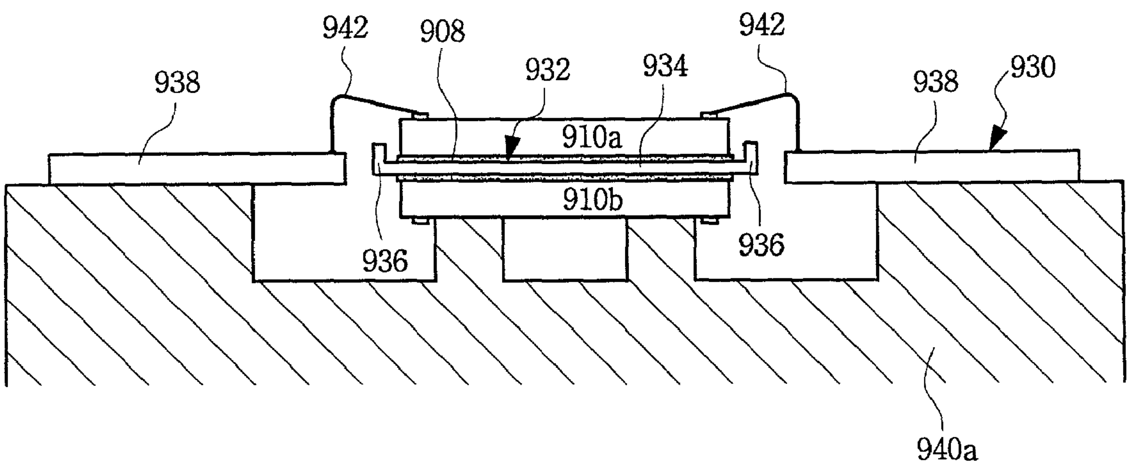

Referring to FIG. 13*g*, the lead frame 902 is aligned and fixed onto the supporter 940*a* and the upper chip 910*a*. The lead frame leads 938 are electrically interconnected by bonding wires 942 in a first wire bonding step. As shown in FIG. 13*h*, the lead frame 902 is aligned and fixed onto the supporter 940*b* and the lower chip 910*b*. The lead frame leads 938 are electrically interconnected by bonding wires 945 in a second wire bonding step. The order of the wire bonding steps is not significant. However, considering the bondability of wires 942 and 945, it is preferable to shorten wires 942 connected to the chips disposed in the direction of the protrusion of the peripheral part 936, in this case upper chip 910*a*. This is because the vertical distance from the active surface of the upper chip 910*a* to the peripheral part 936 is smaller than that of the lower chip 910*b*. The first and second wire bonding steps are preferably performed using a reverse wire bonding technology where a capillary forms balls on the lead frame leads 938 and stitches on the chip electrode pads.

Referring to FIG. 13*i*, following the second wire bonding step, the package body 950 is molded using an injection molding process. The lead parts 938, extending outside of the package body 950, are bent and formed in a proper shape to complete the ultra-thin package device.

Because the package device according to the present invention has very small thickness, the curing speed of the package body is higher. It is preferable, therefore to perform the molding step at a low temperature. The formation of the package body is preferably performed in a temperature environment ranging between about 170–175° C.

Applications

The ultra-thin package devices of the present invention can be used in various portable electronic appliances including digital cameras, MP3 players, Handheld Personal Computers (HPCs), Personal Digital Assistants (PDAs), mobile phones, and other devices. FIGS. 14*a* and 14*b*, for example, show a memory card into which an ultra-thin package device of the present invention is integrated. FIG. 14*a* is a plan view of the memory card and FIG. 14*b* is a cross-sectional view taken along the line 14*b*—14*b* of FIG. 14*a*.

Generally, memory cards are produced using flash memories. Several companies presently manufacture memory cards. For example, SmartMedia memory cards by Toshiba, MemoryStick cards by Sony, CompactFlash cards by Sandisk, MultiMedia Cards by Gimens and Sandisk, and SD (Secure Digital) cards are all available. The embodiment shown in FIGS. 14*a* and 14*b* shows the implementation of this invention in a MemoryStick memory card.

Referring to FIGS. 14*a* and 14*b*, a memory card 960 includes a main board 967. Terminal pads 961, a controller mounting area 962, a mounting area for passive elements 963, and a memory mounting area 966 are formed on the main board 967. The memory mounting area 966 is defined by and separated from other areas by an interposer 965. The dimensions of the MemoryStick Duo card 960 are 31.0 mm of length (L), 20.0 mm of width (W), and 1.6 mm of height. The memory mounting area 966 has a length (L1) of 12 mm and a width (W1) of 18 mm. As shown in FIG. 14*b*, the height (H) of the interposer 965 is about 0.7 mm. Since the package device 1000 of the present invention has a thickness of less than 0.58 mm, the package device can be accommodated within the memory mounting area 966 of the memory card 960 without exceeding the maximum height of 0.7 mm of the interposer 965 even when the outer leads of the package device are accounted for. Accordingly, the capacity of the memory card can be at least doubled while still permitting the miniaturization of the memory card.

The thin package technology of the present invention can also be applied to a package device using a single semiconductor IC chip. Examples of this aspect of the invention are shown in FIGS. 15 and 16. Referring to FIG. 15, a package device 550 includes a single semiconductor IC chip 120. A chip attaching part 572*a* of a die pad 572, to which the chip 120 is attached, is thinner than a die pad peripheral part 572*b*. The thickness of the chip attaching part 572*a* is preferably between about 30–50% of the thickness of the peripheral part 572*b*. Leads 516 have the same thickness as the peripheral part 572*b*. The peripheral part 572*b* protrudes upwards towards the chip 120 from the chip attaching part 572*a*, and the die pad is down set to achieve a balanced structure with reference to the leads 516.

For example, when the thickness of the chip 120 is 120 μm, the thickness of an adhesive layer 122 is 20 μm, and the thickness of the leads 516 is 100 μm, then the thickness of the chip attaching part 572*a* should be about 40 μm. The upper and lower portions of the package body 580 have an equal thickness of about 185 μm. In this example, the overall thickness of the package device 550 is 470 μm, and the amount of down set of the die pad is 40 μm.

Referring now to FIG. 16, when a peripheral part 672*b* of a die pad 672 protrudes downwards from a chip attaching part 672*a*, opposite the chip 120, a package body 670 is formed by aligning a top surface of the die pad 672 to the top surfaces of leads 670 and performing an unbalanced molding with reference to the leads 670. In this embodiment, a semiconductor chip 120 is attached to the top surface of the die pad 672 via an adhesive layer 122. For instance, when the thickness of the chip 120 is 120 μm, the thickness of the adhesive layer 122 is 20 μm, the thickness of the leads is 100 μm, and the thickness of the chip attaching part 672*a* is 40 μm, the upper part of the package body 686 has a thickness of 285 μm, while the thickness of the lower part of the package body 686 is 85 μm. It should be noted, however, that the distance from the active surface of the chip 120 to the top surface of the package body 686 is identical to the distance from the back surface of the chip 120 to the bottom surface of the package body 686, thereby providing a vertically balanced structure. According to various aspects of the present invention, it is therefore possible to provide an ultra-thin package device having a thickness of equal to or less than 0.5 mm.

Although various preferred embodiments of this invention have been disclosed and described in the drawings and specification, these embodiments are provided by way of example, and not of limitation. Various modifications to these embodiments, in both arrangement and detail, will be apparent to those skilled in the art. The invention should therefore be interpreted to cover all such modifications coming within the spirit or scope of the following claims.

What is claimed is:

1. An ultra-thin semiconductor package device comprising:

a lead frame having a die pad, a plurality of leads disposed around the die pad, and a tie bar connected to the die pad, said die pad including a chip attaching part having a first thickness and a peripheral part surrounding and protruding away from the chip attaching part;

first and second semiconductor chips each including a plurality of electrode pads, wherein the first semiconductor chip is bonded to a top surface of the chip attaching part and the second semiconductor chip is bonded to a bottom surface of the chip attaching part;

a package body encapsulating the semiconductor chips; and bonding wires configured to electrically connect the plurality of electrode pads and the leads, said leads having inner leads encapsulated with the package body to which the bonding wires are bonded and outer leads exposed from the package body, wherein the inner leads having a second thickness, wherein the first thickness is smaller than the second thickness, wherein the peripheral part has a height equal to the second thickness of the inner leads, and wherein the peripheral part protrudes only in a direction toward the second semiconductor chip.

2. An ultra-thin semiconductor package device according to claim 1, wherein the die pad is disposed below the leads.

3. An ultra-thin semiconductor package device according to claim 1, wherein the bonding wires are connected by balls formed on the leads and stitches formed on the electrode pads.

4. An ultra-thin semiconductor package device according to claim 3, wherein metal bumps are formed on the electrode pads and wherein the stitches are formed on the metal bumps.

5. An ultra-thin semiconductor package device according to claim 1, wherein the die pad comprises divided first and second die pads.

6. An ultra-thin semiconductor package device according to claim 5, wherein the first and second die pads each include a corresponding chip attaching part and a corresponding peripheral part.

7. An ultra-thin semiconductor package device according to claim 1, wherein an adhesive bonds the semiconductor chip to the die pad chip attaching part.

8. An ultra-thin semiconductor package device according to claim 1, wherein a thickness of the package body is about 580 μm, a thickness of the die pad peripheral part is about 100 μm, and a thickness of the chip attaching part is about 40 μm.

9. An ultra-thin semiconductor package device according to claim 1, wherein an adhesive is attached to the backside of the chip in a wafer state to bond the semiconductor chips to the chip attaching part.

10. An ultra-thin semiconductor package device comprising:

a lead frame having a die pad, a plurality of leads disposed around the die pad, and a tie bar connected to the die pad, said die pad including a chip attaching part having a first thickness and a peripheral part surrounding and protruding away from the chip attaching part;

first and second semiconductor chips each including a plurality of electrode pads, wherein the first semiconductor chip is bonded to a top surface of the chip attaching part and the second semiconductor chip is bonded to a bottom surface of the chip attaching part, the peripheral part protruding towards only one of the first and second semiconductor chips;

a package body encapsulating the semiconductor chips; and bonding wires configured to electrically connect the plurality of electrode pads and the leads, said leads having inner leads encapsulated with the package body to which the bonding wires are bonded and outer leads exposed from the package body, wherein the inner leads having a second thickness, wherein the first thickness is smaller than the second thickness, wherein the peripheral part has a height equal to the second thickness of the inner leads, and wherein the bonding wires connected to the one of the first and second semiconductor chips are shorter than the bonding wires connected to the other semiconductor chip.

11. An electronic apparatus including a semiconductor package device having a package body of less than 0.7 mm of thickness, said semiconductor package device comprising:

a lead frame including a die pad, a plurality of single-layer leads disposed around the die pad, and a tie bar disposed around and connected to the die pad, wherein said die pad includes a chip attaching part and a peripheral part surrounding the chip attaching part, the chip attaching part and the peripheral part having the same thickness;

a semiconductor chip having a plurality of electrode pads formed on an active surface of the chip, said chip connected to the chip attaching part, the peripheral part protruding away from the die pad chip attaching part only in a direction away from the semiconductor chip;

a package body for encapsulating the semiconductor chip;

bonding wires encapsulated by the package body, said bonding wires configured to electrically connect the electrode pads of the semiconductor chip to the leads, wherein each of the plurality of single-layer leads comprises an inner lead bonded to the bonding wire and encapsulated by the package body and an outer lead integral to the inner leads and extending from the package body; and wherein the chip attaching part has a first thickness and the inner lead has a second thickness that is greater than the first thickness.

12. An electronic apparatus according to claim 11, wherein the electronic apparatus is a memory card.

13. The semiconductor package device of claim 11, wherein the first thickness is between about 30% to 50% of the second thickness.

14. The semiconductor package device of claim 11 further comprising another semiconductor chip attached to a back side of the chip attaching part.

15. The semiconductor package device of claim 11, wherein the die pad is located below the leads.

16. The semiconductor package device of claim 15, wherein the tie bar has the same thickness as the leads.

17. The semiconductor package of claim 11, wherein the plurality of electrode pads are electrically interconnected to the leads via bonding wires, and wherein the bonding wires are connected by balls formed on the surface of the leads and stitches formed on the electrode pads.

18. The semiconductor package device of claim 17, wherein metal bumps are formed on the electrode pads of the chip and the stitches are formed on the metal bumps.

19. The semiconductor package device of claim 17, wherein the lead frame is made of iron-nickel alloy or copper alloy, and wherein the bonding wires are gold wires.

20. The semiconductor package device of claim 11, wherein an upper portion of the package body above the leads and a lower portion of the package body below the leads have different thicknesses.

21. The semiconductor package device of claim 11, wherein the tie bar has the same thickness as the die pad peripheral part.

22. The semiconductor package device of claim 11, wherein the die pad comprises divided first and second die pads.

23. The semiconductor package of claim 22, wherein the first and second die pads each include a chip attaching part and a peripheral part.

24. The semiconductor package device of claim 11, wherein an adhesive bonds the semiconductor chip to the die pad chip attaching part.

25. The semiconductor package device of claim 11, wherein the semiconductor chip is a memory device and wherein the adhesive is a film-type adhesive tape made of an epoxy resin.

26. An ultra-thin semiconductor package device comprising:

a lead frame comprising a die pad, a plurality of single-layer leads disposed around the die pad, wherein each of the plurality of single-layer leads comprises an inner lead and an outer lead, and tic bars connected to and disposed around the die pad, wherein said die pad comprises a chip attaching part and a peripheral part surrounding the chip attaching part;

a semiconductor chip mounted to the die pad chip attaching part, said chip having a plurality of electrode pads, wherein each of the plurality of electrode pads is electrically connected to at least one of the plurality of single-layer leads with a bonding wire, the peripheral part protruding away from the die pad chip attaching part only in a direction away from the semiconductor chip;

an encapsulant encapsulating the semiconductor chip to farm a package body, wherein said inner leads are encapsulated by the encapsulant and said outer leads are external to the encapsulant, and said chip attaching part having a first thickness and a portion of the inner leads having a second thickness greater than the first thickness, wherein the bonding wires are directly connected to the portion of the inner leads, and wherein the chip attaching part and the peripheral part have the same thickness.

27. The ultra-thin semiconductor package device according to claim 26, wherein the first thickness is between about 30% to 50% of the second thickness.

28. The ultra-thin semiconductor package device according to claim 26, further comprising another semiconductor chip attached to a back side of the chip attaching part.

29. The ultra-thin semiconductor package device of claim 28, wherein the semiconductor chip and the another semiconductor chip are of the same type.

30. The ultra-thin semiconductor package device according to claim 26, wherein the die pad is located below the leads.

31. The ultra-thin semiconductor package device according to claim 30, wherein the tie bar has the same thickness as the leads.

32. The ultra-thin semiconductor package according to claim 26, wherein the plurality of electrode pads are electrically interconnected to the leads via bonding wires, and wherein the bonding wires are connected by bails formed on the surface of the leads and stitches formed on the electrode pads.

33. The ultra-thin semiconductor package device according to claim 32, wherein metal bumps are formed on the electrode pads of the chip and the stitches are formed on the metal bumps.

34. The ultra-thin semiconductor package device according to claim 32, wherein the lead frame is made of iron-nickel alloy or copper alloy, and wherein the bonding wires are gold wires.

35. The ultra-thin semiconductor package device according to claim 26, wherein an upper portion of the package body above the leads and a lower portion of the package body below the leads have different thicknesses.

36. The ultra-thin semiconductor package device according to claim 26, wherein the tie bar has the same thickness as the die pad peripheral part.

37. The ultra-thin semiconductor package device according to claim 26, wherein the die pad comprises divided first and second die pads.

38. The ultra-thin semiconductor package device according to claim 37, wherein the first and second die pads each include a chip attaching part and a peripheral part.

39. The ultra-thin semiconductor package device according to claim 26, wherein an adhesive bonds the semiconductor chip to the die pad chip attaching part.

40. The ultra-thin semiconductor package device according to claim 26, wherein the semiconductor chip is a memory device and wherein the adhesive is a film-type adhesive tape made of an epoxy resin.

41. A semiconductor package device comprising:

a lead frame that includes a die pad, leads disposed around the die pad, and tie bars connected to the die pad, the die pad including a chip attaching part having a first thickness and a peripheral part surrounding the chip attaching part;

an upper and a lower semiconductor chip that include electrode pads connected to the leads by bonding wires, the upper semiconductor chip bonded to an upper surface of the chip attaching part and the lower semiconductor chip bonded to a lower surface of the chip attaching part, the peripheral part protruding only in a direction towards the lower semiconductor chip; and a package body that encapsulates the upper and the lower semiconductor chips, the die pad, the bonding wires, and a portion of the leads to define inner leads that are disposed inside the package body and outer leads that are disposed outside the package body, the inner leads having a second thickness that is greater than the first thickness.

42. The semiconductor package device according to claim 41, wherein the plurality of leads are formed of a single layer.

43. The semiconductor package device according to claim 41, wherein the first thickness is between about 30% to 50% of the second thickness.

44. The semiconductor package according to claim 41, wherein the bonding wires are connected to the leads by balls formed on the surface of the leads and wherein the bonding wires are connected to the electrode pads by stitches formed on the electrode pads.

45. The semiconductor package device according to claim 41, wherein a metal bump is formed on the electrode pads and the stitches are formed on the metal bumps.

46. The semiconductor package device according to claim 41, wherein an upper portion of the package body above the leads and a lower portion of the package body below the leads have different thicknesses.

47. The semiconductor package device according to claim 41, wherein the tie bars have the same thickness as the leads.

48. The semiconductor package device according to claim 41, wherein the tie bars have the same thickness as the peripheral part.

49. The semiconductor package device according to claim 41, wherein the peripheral part protrudes in both vertical directions from the chip attaching part, and the thickness of the peripheral part is equal to the second thickness.

50. The semiconductor package device according to claim 41, wherein the die pad comprises divided first and second die pads.

51. The semiconductor package device according to claim 50, wherein the first and second die pads each include a chip attaching part and a peripheral part.

52. The semiconductor package device according to claim 41, wherein an adhesive bonds the first and the second semiconductor chips to the chip attaching part.

53. The semiconductor package device according to claim 52, wherein the first and the second semiconductor chips are memory devices and wherein the adhesive is a film-type adhesive tape made of an epoxy resin.

54. The semiconductor package device according to claim 41, wherein the lead frame is made of iron-nickel alloy or copper alloy, and wherein the bonding wires are gold wires.

55. An ultra-thin semiconductor package device comprising:

a lead frame comprising a die pad, a plurality of leads disposed around the die pad, and tie bars connected to and disposed around the die pad, wherein said die pad comprises a chip attaching part and a peripheral part surrounding the chip attaching part;

a first semiconductor chip mounted to a lower side of the chip attaching part and a second semiconductor chip mounted to an upper side of the chip attaching part, said first and second semiconductor chips having a plurality of electrode pads, the peripheral part perpendicular to the chip attaching part, the peripheral part having a lower surface that is parallel to but not coplanar with the lower side and an upper surface that is coplanar with the upper side, wherein the plurality of electrode pads are electrically interconnected to the leads, and wherein each of the leads comprises integrally connected inner leads and outer leads;

an encapsulant encapsulating the semiconductor chip to form a package body, wherein said inner leads are encapsulated by the encapsulant and said outer leads are external to the encapsulant; and said chip attaching part having a first thickness and the inner leads having a second thickness greater than the first thickness.

56. The ultra-thin semiconductor package device of claim 55, wherein the peripheral part protrudes from only one side of the chip attaching part.

57. The ultra-thin semiconductor package device of claim 55, wherein the peripheral part protrudes upward from the chip attaching part.

58. An ultra-thin semiconductor package device comprising:

a lead frame having a die pad, a plurality of leads disposed around the die pad, and a tie bar connected to the die pad, said die pad including a chip attaching part having a first thickness and a peripheral part surrounding and protruding away from the chip attaching part;

at least one semiconductor chip, the at least one semiconductor chip including a plurality of electrode pads, wherein the at least one semiconductor chip is bonded to a surface of the chip attaching part;

a package body encapsulating the at least one semiconductor chip; and bonding wires configured to electrically connect the plurality of electrode pads and the leads, said leads having inner leads encapsulated with the package body to which the bonding wires are bonded and outer leads exposed from the package body, wherein the inner leads have a second thickness, wherein the first thickness is smaller than the second thickness, and wherein the peripheral part only protrudes downward.

59. The ultra-thin semiconductor package device of claim 58, wherein the at least one semiconductor chip is attached to a top surface of the chip attaching part.

60. The ultra-thin semiconductor package device of claim 58, wherein the at least one semiconductor chip is attached to a bottom surface of the chip attaching part.

61. The ultra-thin semiconductor package device of claim 58, wherein the at least one semiconductor chip is attached to a top surface of the chip attaching part, and wherein at least one other semiconductor chip is attached to a bottom surface of the chip attaching part.

62. The ultra-thin semiconductor package device of claim 58, wherein the peripheral part has a thickness equal to the second thickness.

63. An ultra-thin semiconductor package device comprising:

a lead frame having a die pad, a plurality of leads disposed around the die pad, and a tie bar connected to the die pad, said die pad including a chip attaching part having a first thickness and a peripheral part surrounding and protruding away from the chip attaching part;

a semiconductor chip, the semiconductor chip including a plurality of electrode pads, the semiconductor chip bonded to a surface of the chip attaching part, the peripheral part only protruding away from the semiconductor chip;

a package body encapsulating the semiconductor chip; and bonding wires configured to electrically connect the plurality of electrode pads and the leads, said leads having inner leads encapsulated with the package body to which the bonding wires are bonded and outer leads exposed from the package body, the inner leads having a second thickness that is greater than the first thickness.

* * * * *

UNITED STATES PATENT AND TRADEMARK OFFICE

CERTIFICATE OF CORRECTION

PATENT NO. : 7,012,325 B2
APPLICATION NO. : 10/008704
DATED : March 14, 2006
INVENTOR(S) : Ahn et al.

It is certified that error appears in the above-identified patent and that said Letters Patent is hereby corrected as shown below:

Column 16, line 40, please replace “tic bars” with --tie bars--

Column 16, line 55, please replace “encapsulant,” with --encapsulant;--

Column 17, line 13, please replace “bails” with --balls--

Signed and Sealed this

Thirteenth Day of February, 2007

JON W. DUDAS
*Director of the United States Patent and Trademark Office*